United States Patent
Nakai et al.

(10) Patent No.: US 8,198,544 B2
(45) Date of Patent: *Jun. 12, 2012

(54) PRINTED WIRING BOARD AND MANUFACTURING METHOD THEREOF

(75) Inventors: Toru Nakai, Ibi-gun (JP); Masanori Tamaki, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/821,196

(22) Filed: Jun. 23, 2010

(65) Prior Publication Data

US 2010/0252308 A1 Oct. 7, 2010

Related U.S. Application Data

(63) Continuation of application No. 11/763,861, filed on Jun. 15, 2007, now Pat. No. 7,804,031, which is a continuation of application No. PCT/JP05/023440, filed on Dec. 15, 2005.

(30) Foreign Application Priority Data

| Dec. 15, 2004 | (JP) | 2004-363135 |
| Oct. 18, 2005 | (JP) | 2005-303039 |
| Dec. 14, 2005 | (JP) | 2005-360283 |

(51) Int. Cl.
*H05K 1/03* (2006.01)

(52) U.S. Cl. ...... 174/255; 174/262
(58) Field of Classification Search .......... None
See application file for complete search history.

(56) References Cited

U.S. PATENT DOCUMENTS

| 6,323,435 | B1 | 11/2001 | Strandberg et al. |
| 6,340,798 | B1 * | 1/2002 | Tokuda .......... 174/261 |
| 6,591,495 | B2 * | 7/2003 | Hirose et al. ...... 29/846 |
| 7,804,031 | B2 * | 9/2010 | Nakai et al. ...... 174/255 |
| 2001/0002728 | A1 * | 6/2001 | Tsukada et al. ...... 257/693 |

(Continued)

FOREIGN PATENT DOCUMENTS

EP 1 713 314 A1 10/2006

(Continued)

OTHER PUBLICATIONS

Deepak Nayak et al., "Calculation of Electrical Parameters of a Thin-Film Multichip Package", IEEE Transactions on Components, Hybrids, and Manufacturing Technology, vol. 12, No. 2, XP002516134, Jun. 1989, pp. 303-309.

(Continued)

*Primary Examiner* — Ishwarbhai Patel
(74) *Attorney, Agent, or Firm* — Oblon, Spivak, McClelland, Maier & Neustadt, L.L.P.

(57) ABSTRACT

A printed wiring board including resin insulation layers, and conductive circuits formed between the resin insulation layers such that spaces between the conductive circuits are filled with a resin material of the resin insulation layers. The conductor circuits include a first conductive circuit and a second conductive circuit positioned adjacent to the first conductive circuit, each of the first and second conductive circuits has a trapezoidal cross section, and the first and the second conductive circuits satisfy a formula, $0.10T \leq |W1-W2| \leq 0.73T$ where W1 represents a width of a space between upper surfaces of the first and second conductive circuits, W2 represents a width of a space between lower surfaces of the first and second conductive circuits, and T represents a thickness of each of the first and second conductive circuit.

18 Claims, 12 Drawing Sheets

U.S. PATENT DOCUMENTS

| | | |
|---|---|---|
| 2004/0011555 A1 | 1/2004 | Chiu |
| 2004/0026781 A1 | 2/2004 | Nakai |
| 2006/0243478 A1 | 11/2006 | Inagaki et al. |

FOREIGN PATENT DOCUMENTS

| | | |
|---|---|---|
| JP | 61-267396 | 11/1986 |
| JP | 6-57453 | 3/1994 |
| JP | 6-314862 | 11/1994 |
| JP | 11-176985 | 7/1999 |
| JP | 11-243279 | 9/1999 |
| JP | 2001-156408 | 6/2001 |
| WO | WO 2005/076683 A1 | 8/2005 |

OTHER PUBLICATIONS

Daniel G. Swanson, Jr., "What's My Impedance", IEEE Microwave Magazine, IEEE Service Center, vol. 2, No. 4, XP011092072, Dec. 1, 2001, pp. 1-11.

Narain D. Arora, "Modeling and Characterization of Copper Interconnects for SoC Design", IEEE International Conference on Simulation of Semiconductor Processes and Devices, XP002516133, Sep. 29, 2003, pp. 1-6.

* cited by examiner

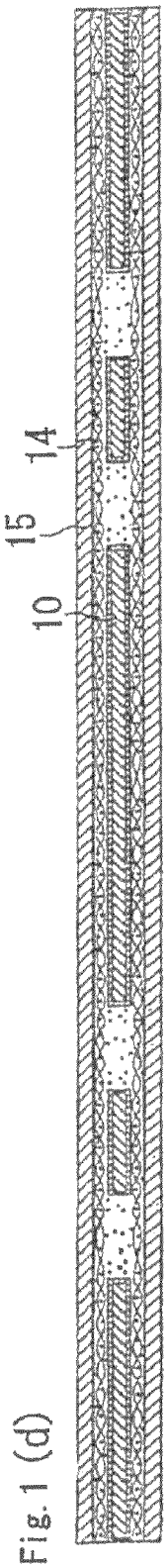
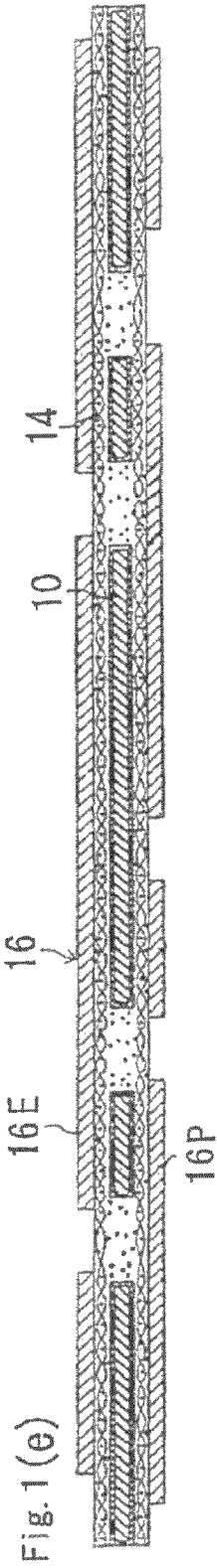

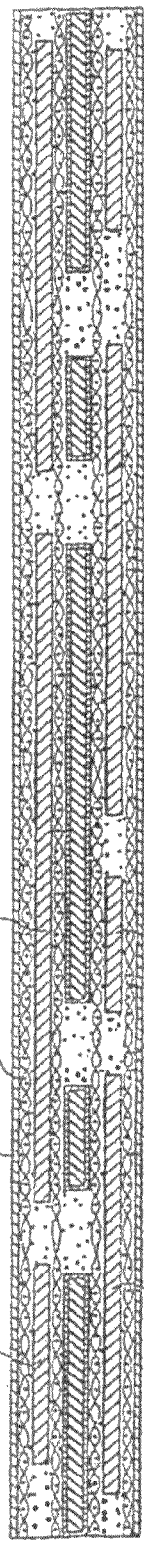
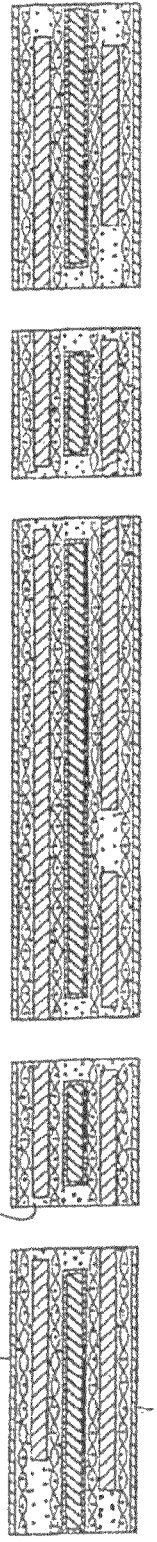
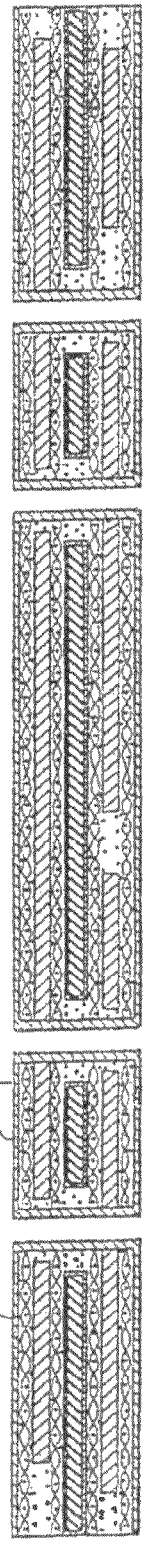
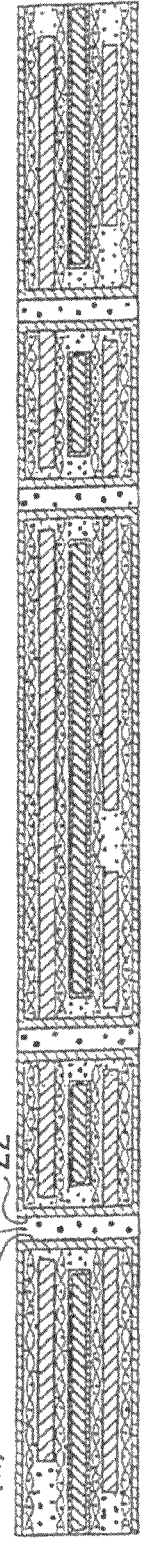

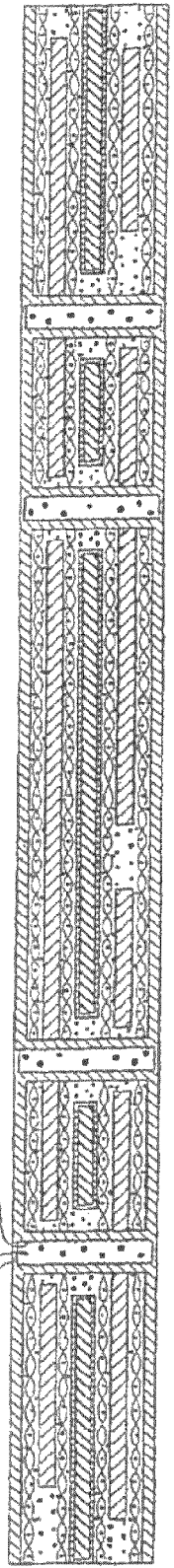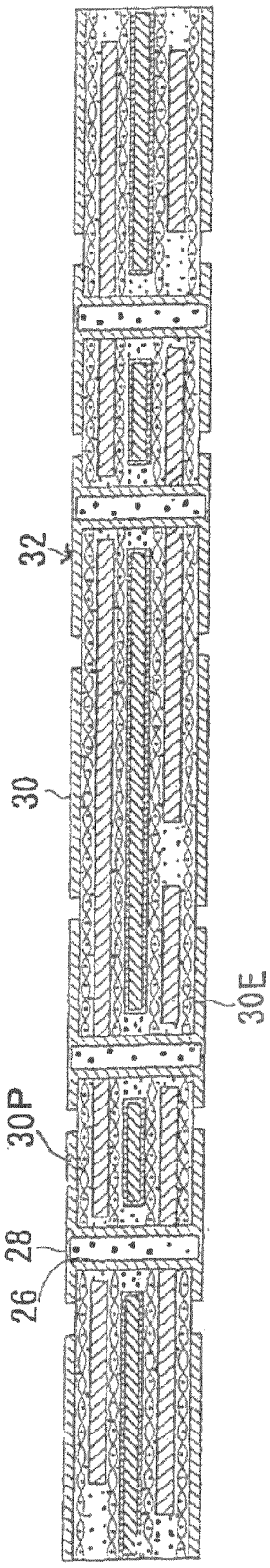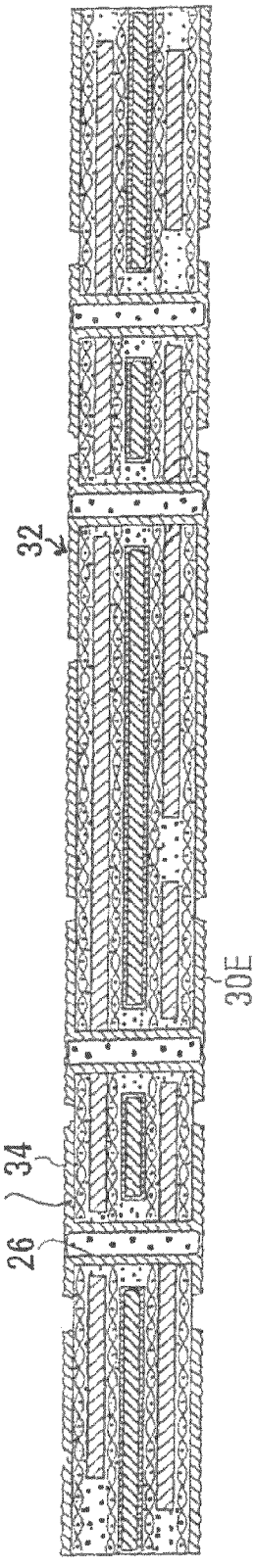
Fig.3 (a), Fig.3 (b), Fig.3 (c)

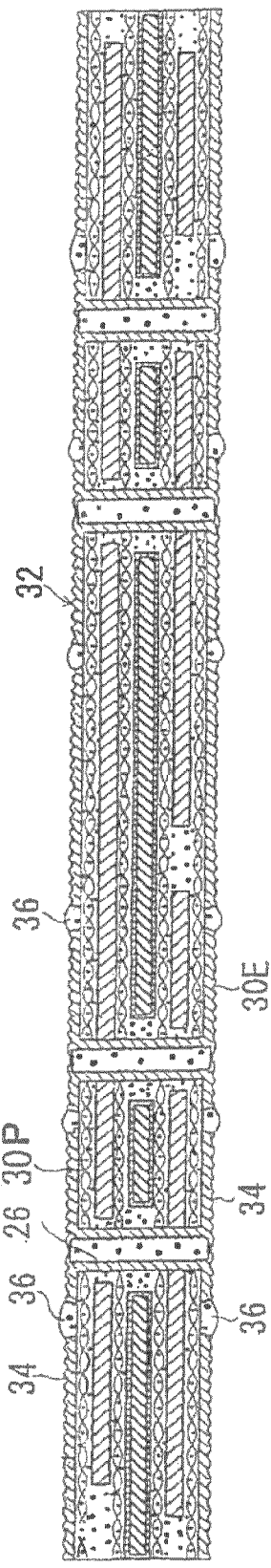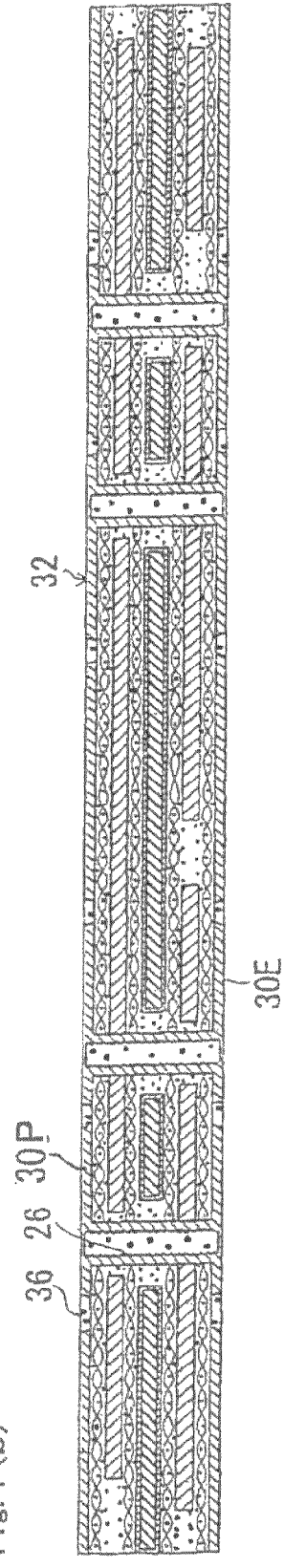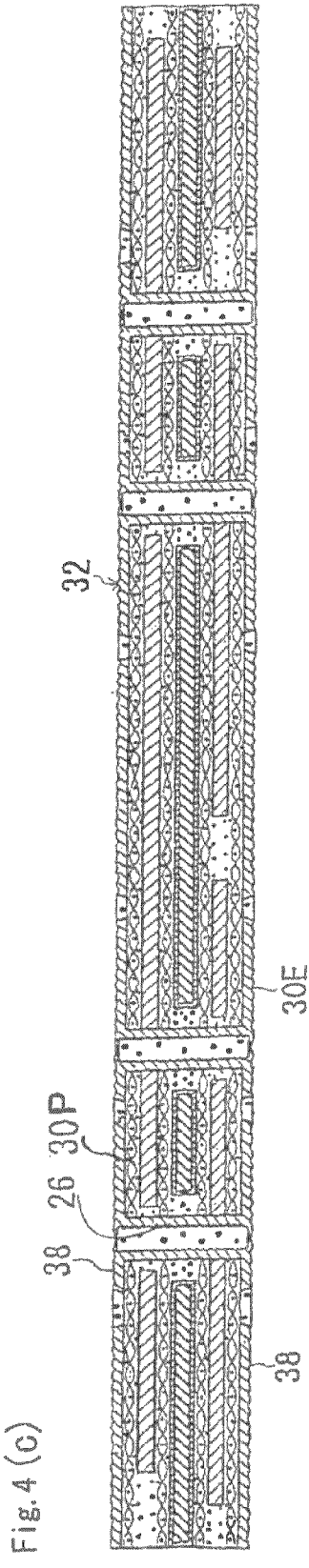

PRINTED WIRING BOARD AND MANUFACTURING METHOD THEREOF

CROSS-REFERENCE TO RELATED APPLICATIONS

This application is a continuation of and claims benefit of priority from U.S. application Ser. No. 11/763,861, filed Jun. 15, 2007, the entire contents of which are hereby incorporated by reference. U.S. application Ser. No. 11/763,861 is a continuation of PCT application, PCT/JP2005/023440, filed Dec. 15, 2005, and claims the benefit of priority to Japanese Patent Application Nos. 2004-363135, filed Dec. 15, 2004, 2005-303039, filed Oct. 18, 2005, and 2005-360283, filed Dec. 14, 2005. The contents of these applications are incorporated herein by reference in their entirety.

BACKGROUND OF THE INVENTION

1. Field of the Invention

The present invention relates to a printed wiring board and a method of manufacturing the printed wiring board.

2. Discussion of the Background

A build-up printed wiring board is a type of a printed wiring board (hereinafter referred to as "PWB") that has insulation material filled between conductive circuits. Japanese Patent Laid-Open Publications H11-176985 and H11-243279 describe build-up PWBs in which conductive circuits and interlayer insulation resin layers are alternately laminated, and the conductive circuits provided on lower and upper layers are electrically connected through via-holes. In these PWBs, spaces between the wiring patterns forming conductive circuits are filled with dielectric interlayer insulation layers. The conductive circuits have cross sections that are substantially rectangular, and thus side faces of the conductive circuits are substantially parallel to one another. The contents of the above publications are incorporated herein by reference in their entirety.

Also, Japanese Patent Laid-Open Publication H06-57453 describes an etching process. In this process, a substrate having a metal layer formed on its base material is prepared; an etching resist is formed on the substrate; a resist-pattern is formed by exposing to light and developing the resist layer; the metal layer portion in the area where the etching resist is not formed is dissolved and removed; the etching resist: is exfoliated; and the metal layer under the resist becomes a conductive circuit with a prescribed pattern. That is, using a subtractive method or a tenting method, conductive circuit is formed after etching away the metal layer exposed in the area where the etching resist is not formed. However, resultant conductive circuits tend to have a smaller cross-section, since the metal layer is etched both in vertical and horizontal directions on the substrate surface. Accordingly, compared with the conductive circuits formed using an additive method, conductor resistance values are higher.

ICs have become faster in recent years, and at the same time wiring patterns of PWBs equipped with such ICs have become even more microscopic. Such ICs occasionally experience malfunctions due to crosstalk or delayed signal transmission in a PWB where (L/S) is 15/15 µm or less, when (L) is the smallest conductor width and (S) is the smallest space. Therefore, a PWB which has a smaller (L/S) but reduced crosstalk and delayed signal transmission is desired. Also, a manufacturing method which allows a PWB to have conductive circuits with lower resistance is desired.

SUMMARY OF THE INVENTION

According to one aspect of the present invention, a printed wiring board has an interlayer insulation layer and conductive circuits formed on the interlayer insulation layer. The conductive circuits include a first conductive circuit and a second conductive circuit positioned adjacent to each other, and the first and second conductive circuits satisfy a formula, $0.10T \leq |W1-W2| \leq 0.73T$, where (W1) represents an upper conductive circuit space between the first and second conductive circuits, (W2) represents a lower conductive circuit space between the first and second conductive circuits, and (T) represents a thickness of the first and second conductive circuits.

According to another aspect of the present invention, in a method of manufacturing a printed wiring board, an interlayer insulation layer is formed, and plural conductive circuits are formed on the interlayer insulation layer. In forming the conductive circuits, a first conductive circuit and a second conductive circuit are formed adjacent to each other on the interlayer insulation layer such that the first and second conductive circuits satisfy a formula, $0.10T \leq |W1-W2| \leq 0.73T$, where (W1) represents an upper conductive circuit space between the first and second conductive circuits, (W2) represents a lower conductive circuit space between the first and second conductive circuits, and (T) represents a thickness of the first and second conductive circuits.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1(a)-1(e) are cross-sectional views of a multilayered PWB during a manufacturing process according to one embodiment of the present invention;

FIGS. 2(a)-2(d) are cross-sectional views of the multilayered PWB during the manufacturing process;

FIGS. 3(a)-3(c) are cross-sectional views of the multilayered PWB during the manufacturing process;

FIGS. 4(a)-4(c) are cross-sectional views of the multilayered PWB during the manufacturing process;

DESCRIPTION OF THE EMBODIMENTS

Figure 5A:
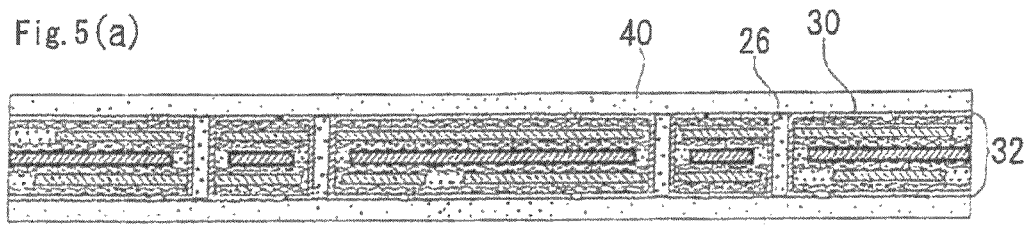
FIGS. 5(a)-5(d) are cross-sectional views of the multilayered PWB during the manufacturing process.

The embodiments will now be described with reference to the accompanying drawings, wherein like reference numerals designate corresponding or identical elements throughout the various drawings.

Figure 8:
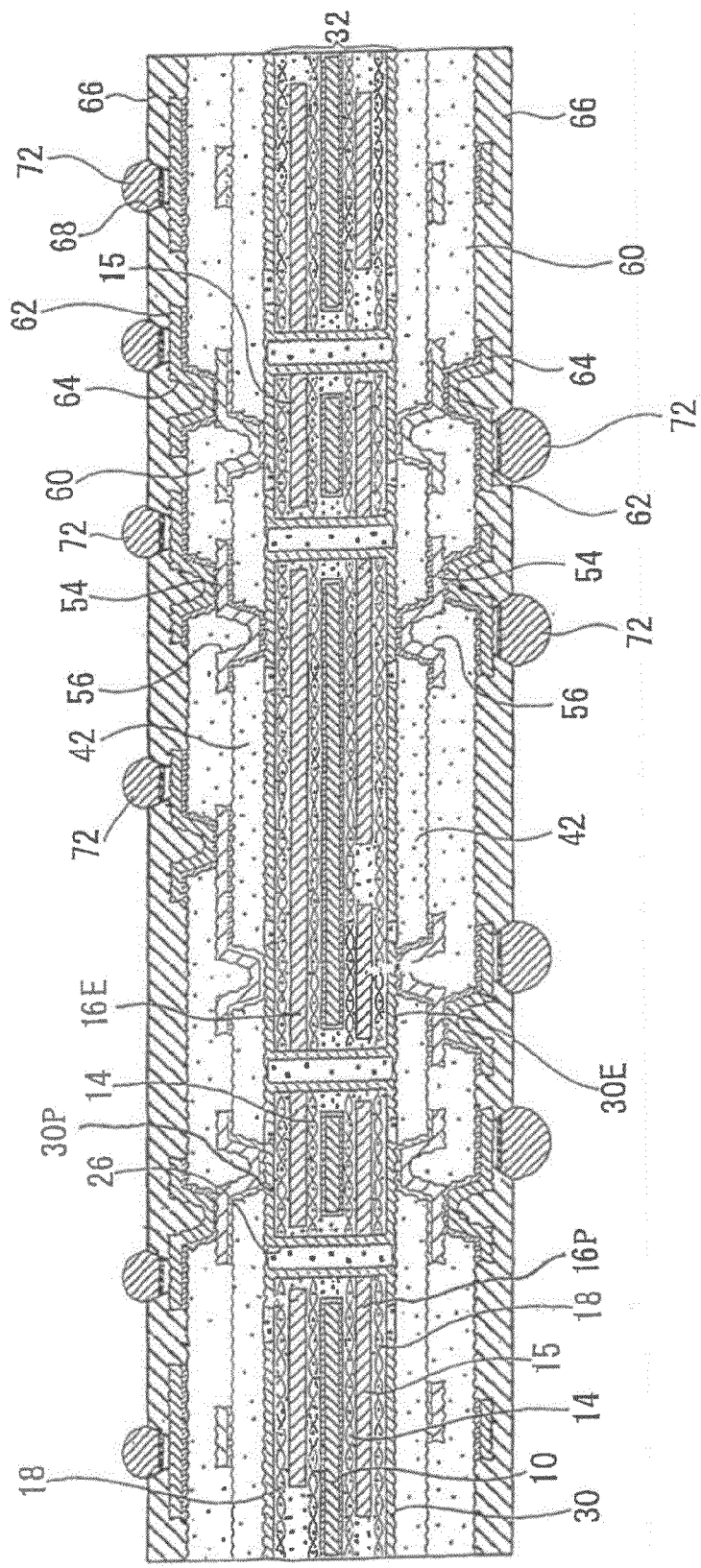
FIG. 8 is a cross-sectional view of a multilayered PWB according to one embodiment of the present invention.
Figure 9:
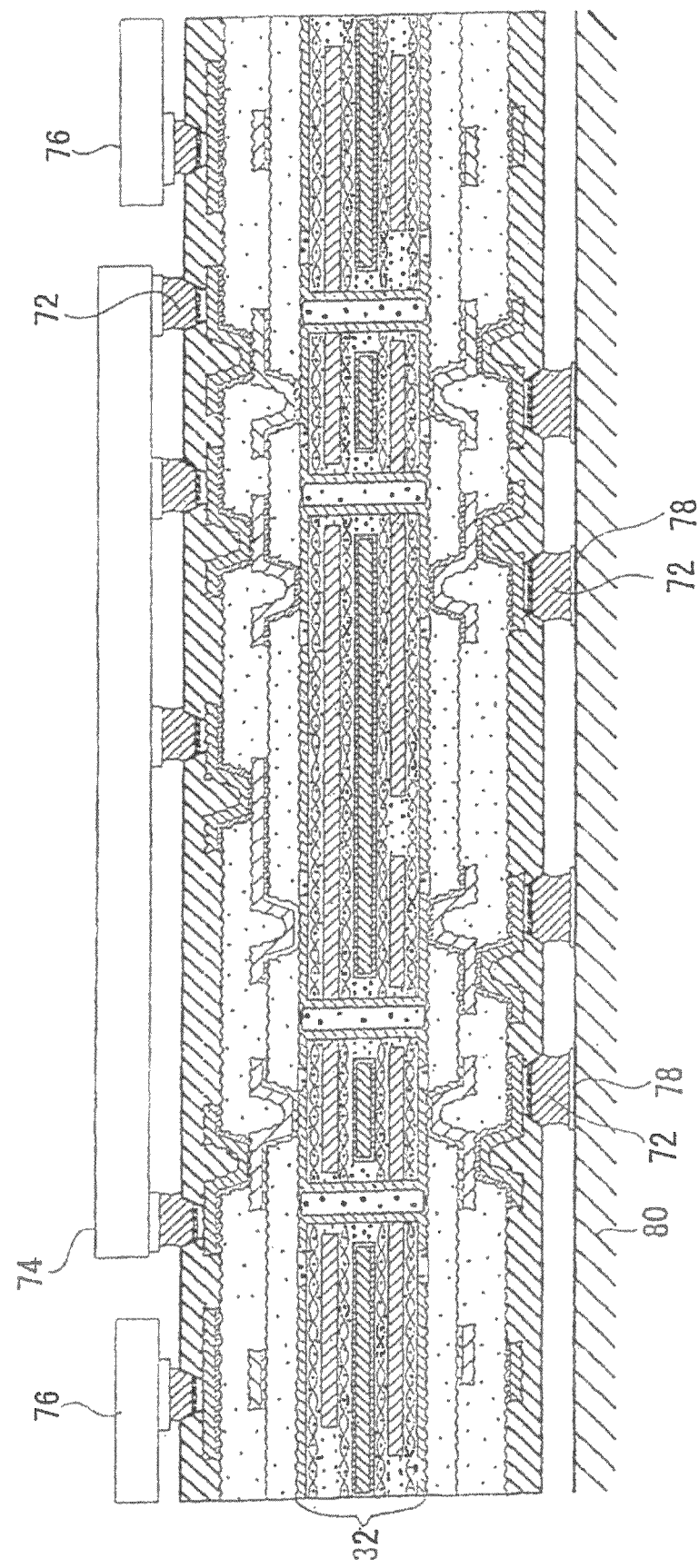
FIG. 9 is a cross-sectional view of a multilayered PWB according to one embodiment of the present invention with a mounted IC chip.

FIGS. 8 and 9 are cross-sectional views of a multilayered PWB according to one embodiment of the present invention. Referring to FIG. 8, the multilayered PWB has a core substrate 32, first interlayer insulation layers 42 formed on the core substrate 32, conductive circuits 54 and via-hole conductors 56 provided on the first interlayer insulation layers 42, second interlayer insulation layers 60 formed on the first interlayer insulation layers 42, and top-layer conductive circuits 62 and via-hole conductors 64 provided on the second interlayer insulation layers 60. On top of the second interlayer insulation layers 60, solder-resist layers 66 having openings 68 are formed, and solder bumps 72 are provided in the respective openings 68. As illustrated in FIG. 9, IC chips 74 and chip capacitors 76 are mounted on the multilayered PWB via the solder bumps 72, and the multilayered PWB is installed on a mother board 80 through the solder bumps 72 and external terminals 78. Referring back to FIG. 8, the core substrate 32 has a metal board 10, inner insulation layers 14 formed on the metal board 10, inner conductive layers 15 formed on the respective inner insulation layers 14, outer insulation layers 18 formed on the inner conductive layers 15, and outer conductive circuits 30 formed on the outer insulation layers 18. The core substrate 32 also has conductive through-hole structures 26 described below in more detail. The inner conductive layers 15 are patterned to have a power source layer (16P) and a ground layer (16E), and the outer conductive circuits 30 are patterned to have a power-source layer (30P) and ground layer (30E).

Figure 10:
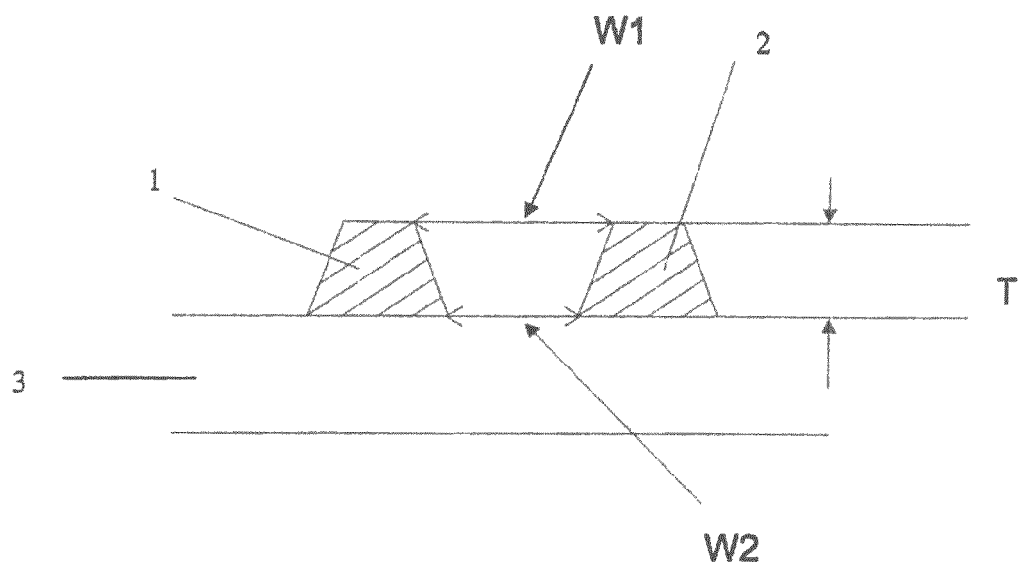
FIG. 10 is a schematic illustration showing exemplary cross sections of conductive circuits in a multilayered PWB according to one embodiment of the present invention.

FIG. 10 is a schematic illustration showing exemplary cross sections of conductive circuits provided in a multilayered PWB according to one embodiment of the present invention. Referring to FIG. 10, the multilayered PWB includes first conductive circuit 1 and second conductive circuit 2 that are formed adjacent to each other on an insulation layer 3. In the present embodiment, "conductive circuits adjacent to each other" refer to conductive circuits that are formed next to each other on the same insulation layer. The first conductive circuit 1 and second conductive circuit 2 shown in FIG. 10 correspond to adjacent conductive circuits among the conductive circuits 54 or among the top-layer conductive circuits 62 in the PWB of FIG. 8. Also, insulation layer 3 corresponds to the first interlayer insulation layer 42 or second interlayer insulation layer 60 in the PWB of FIG. 8. The first conductive circuit 1 and second conductive circuit 2 satisfy the formula, $0.10T \leq |W1-W2| \leq 0.73T$, where (W1) represents an upper conductive circuit space between the first conductive circuit 1 and the second conductive circuit 2, (W2) represents a lower conductive circuit space between the first conductive circuit 1 and the second conductive circuit 2, and (T) represents a thickness of the first conductive circuit 1 and second conductive circuit 2. By providing such conductive circuits having $|W1-W2|$ in the above range, facing sides of the adjacent conductive circuits are not parallel to each other, and the capacitor capacity between the adjacent conductive circuits is reduced. Accordingly, crosstalk or delayed signal transmission are more effectively prevented even when a high-speed IC is mounted on the PWB.

In FIG. 10, the first conductive circuit 1 and second conductive circuit 2 are formed to have slanting side faces on both sides thereof, and the first conductive circuit 1 and second conductive circuit 2 have cross sections which are substantially trapezoidal. The term, "substantially trapezoidal," not only includes a shape where angles in the upper portion of the conductive circuit are geometrically acute or obtuse angles, but also includes a slightly rounded shape; the oblique side line of the conductive circuit is not straight but rather is slightly curved; the entire upper surface of the conductive circuit is slightly rounded; and the upper surface and/or the slope of the conductive circuit are irregularly roughened. Namely, the cross-sectional shape is not rectangular, but is observed to be trapezoidal as a whole.

The term, "upper conductive circuit space (W1)," is defined as the distance between the upper edges of adjacent conductive circuits when the angles in the upper portion of the conductive circuits are observed as geometrically acute or obtuse. The term, "lower conductive circuit space (W2)," is defined as the distance between lower edges of the facing two oblique sides in the cross-sections of the adjacent conductive circuits.

If the above angular portions are slightly rounded, (W1) is defined as the distance between two points where two lines, each of which is extended from the straight portion of the facing two oblique lines, and a line which is extended from the upper straight portion intersect at the cross-sections of the adjacent conductive circuits. If the entire upper surface of the conductive circuit is slightly rounded, (W1) is defined as the distance between two points where the lines, each of which is extended from the facing oblique lines, and a straight line that makes contact at the vertex of the rounded surface and is parallel to the substrate, intersect at the cross-sections of the adjacent conductive circuits.

If roughened surfaces are formed on the upper surface and/or sides of the conductive circuit, the above (W1) and (W2) can be calculated approximately by using the lines connecting the top points of the roughened surfaces as the upper surface line and/or the oblique line.

The reason the conductive circuit thickness (T) is included in the above formula is that the conductive circuit thickness (T) affects the capacitor capacity between the adjacent conductive circuits. When the facing sides of the adjacent conductive circuits are not parallel, but slanted, the capacitor capacity between the conductive circuits is reduced compared with that when the facing sides are parallel. Even if an IC of 2.6 GHz or higher is mounted on a PWB, when $|W1-W2|$ is in the range of 0.10T-0.73T, noise is effectively reduced and malfunctions seldom occur.

On the other hand, if $|W1-W2|$ is smaller than (0.10T), the capacitor capacity between the adjacent conductive circuit increases, and is thus less desirable for high-speed signal transmission. If $|W1-W2|$ exceeds (0.73T), the signal transmission tends to be delayed. The reason for this is that the cross-sectional shapes of the conductive circuits are even more trapezoidal and the conductor volume decreases, causing the resistance value of the conductive circuits to increase, which is disadvantageous for high-speed signal transmission.

It is preferable to make $|W1-W2|$ in the range of 0.35T-0.73T. By providing such conductive circuits, difference in the line width among the conductive circuits is made smaller, and thus transmission speed becomes substantially constant. It is more preferable to make conductive circuits having $|W1-W2|$ in the range of 0.10T-0.35T. By providing such conductive circuits, the conductor volume of the conductive circuits becomes larger, and the resistivity of the conductive circuits is reduced. This structure is more favorable for transmission of high-speed signals. Furthermore, even when a conductive circuit has the (L/S) of 12.5/12.5 μm or less, when $|W1-W2|$ is in the range of 0.10T-0.35T, the conductive circuit secures enough conductor volume and the capacitor capacity between conductive circuits becomes smaller.

In a PWB where the (L/S) of a conductive circuit is minute, the capacitor capacity (electrostatic capacity) between conductive circuits becomes larger. Thus, applying the present embodiment to such a PWB provides significant advantage. The (L/S) is preferably in the range of 5/5 μm-15/15 μm. The reason for this preferred range is that if the (L/S) is smaller than 5/5 μm, the conductor volume is too small and the resistance values of the conductive circuits rise, causing delayed signal transmission. On the other hand, if the (L/S) exceeds 15/15 µm, crosstalk noise seldom occurs, since spaces between lines are large and electrostatic capacity between adjacent conductive circuits decreases. According to the present embodiment, the lower conductive circuit space (W2) is preferred to be 15 µm or less.

In the PWB of the present embodiment, conductive circuit thickness is preferably in the range of 5-20 µm. The reasons for the range are when the thickness is less than 5 µm, conductive circuit resistance values are large; and when the thickness exceeds 20 µm, the capacitor capacity is large, causing the product to be less advantageous for high-speed signal transmission. Consequently, if an IC chip of 2.6 GHz or higher is mounted, malfunctions tend to occur.

Usually, PWBs make a sheet of, for example, 340×510 mm, which includes multiple PWB units. In the present embodiment, the deviation value of |W1−W2| in a unit is preferably (0.04T+2) or less with reference to the conductive circuit thickness (T). The deviation value of |W1−W2| in one unit is expressed as a standard deviation ($\sigma$), which is calculated by equally dividing the unit into four areas and randomly picking up data from eight locations (two sample data are picked up in each divided area). If the deviation ($\sigma$) is in the above range, the transmission speed between each signal line becomes substantially constant, causing substantially no difference in the transmission speed between each signal line. On the other hand, if the deviation ($\sigma$) of |W1−W2| exceeds (0.04T+2), the difference in transmission speed between each signal line becomes larger, and malfunctions tend to occur.

According to the present embodiment, conductive circuits are preferably formed using additive methods including a full-additive method and semi-additive method, but may be formed using vapor deposition.

Cross-sectional shapes of the conductive circuits may be adjusted by changing etching conditions, such as by adjusting spraying pressures or spraying duration, or by using only either set of nozzles installed at the upper section or lower section of the etching equipment. For example, in the process of forming a conductive circuit, if a thinner electroless plating film is formed, the etching time is set shorter and the resultant conductive circuit tends to have a smaller value of |W1−W2| and its cross section becomes closer to rectangular.

If roughened surfaces are formed on side walls of conductive circuits in a PWB, side wall surface sizes of conductive circuits increase remarkably and capacitor capacity between conductive circuits tends to increase accordingly. Thus, applying the present embodiment to a PWB having roughened surfaces on conductive circuit side walls is effective. Therefore, roughened surfaces are preferably formed at least on the side surfaces of conductive circuits in the PWB according to the present embodiment. Roughened surfaces are not limited to certain types, but may be formed by a black oxide treatment, a method using Interplate, an etching process such as Cz treatment, or the like.

Figure 11A:
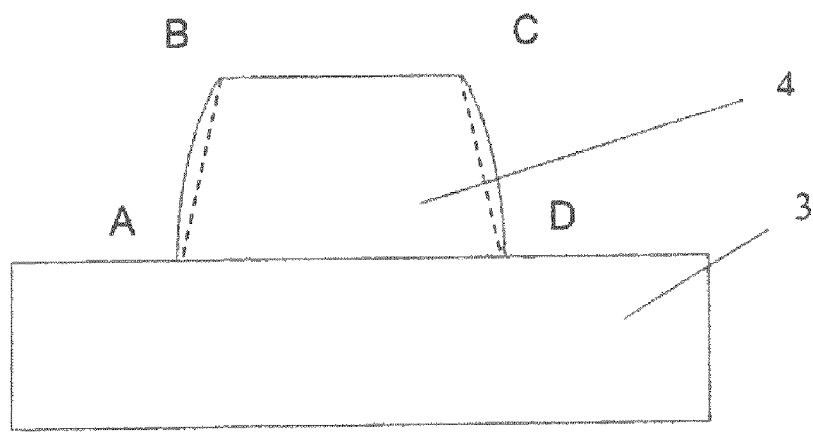
FIGS. 11(a)-11(c) are schematic illustrations showing exemplary cross sections of conductive circuits formed by using an additive method.
Figure 11B:
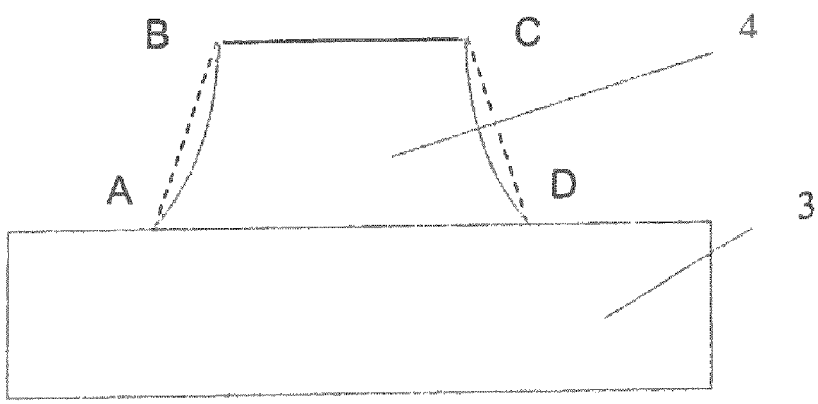
Figure 11C:
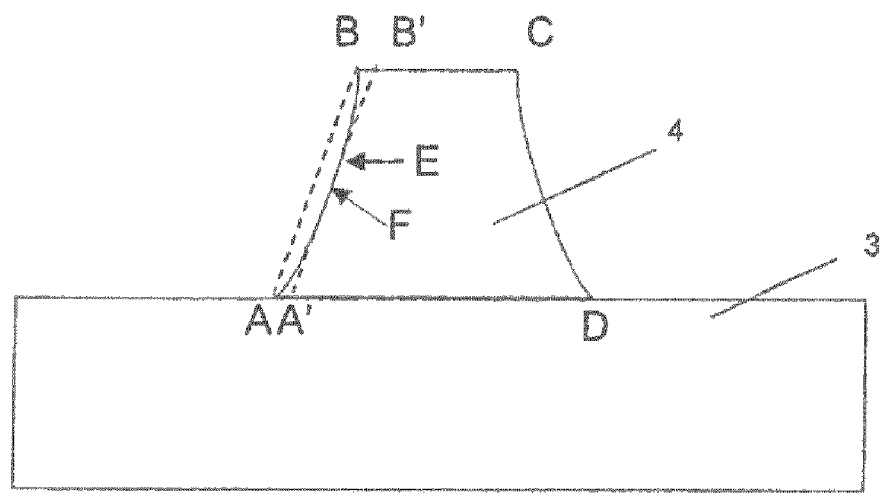

FIGS. 11(a)-11(c) are schematic illustrations showing exemplary cross sections of conductive circuits provided in a PWB according to one embodiment of the present invention. These conductive circuits shown in FIGS. 11(a)-11(c) are formed by additive method and their cross sections are substantially trapezoidal. Referring to FIGS. 11(a)-11(c), the PWB has conductive circuit 4 on insulation layer 3, and the conductive circuit 4 corresponds to one of the conductive circuits 54 and top-layer conductive circuits 62 in the PWB of FIG. 8. Also, insulation layer 3 corresponds to the first interlayer insulation layer 42 or second interlayer insulation layer 60 in the PWB of FIG. 8. These conductive circuits 4 shown in FIGS. 11(a)-11(c) are formed to satisfy the formula, $0.8 \leq S_1/S_0 \leq 1.2$, where ($S_0$) indicates the area of the trapezoidal structure formed by straight lines connecting four vertices (A), (B), (C), (D) in the cross-section of the conductive circuit 4, and ($S_1$) indicates the cross-sectional area of the conductive circuit 4. When this formula related to the area of the conductive circuit is satisfied, the spaces between conductive circuits are set wider while maintaining resistance levels of the conductive circuits lower. More specifically, the conductive circuit 4 shown in FIG. 11(a) has a cross section with side lines slightly curved outwardly from the dotted straight lines (A-B) and (C-D), respectively. When the PWB has a conductive circuit formed to have such a shape as in FIG. 11(a), the conductor volume is made larger, and the conductor resistance is reduced and thus the conductive circuit of FIG. 11(a) is more preferable than those shown in FIGS. 11(b) and 11(c) in terms of high-speed signal transmission. As illustrated in FIGS. 11(b) and 11(c), the conductive circuit 4 may have a cross section with side lines slightly curved inwardly from the dotted straight lines (A-B) and (C-D), respectively. When the conductive circuit has such a shape as in FIGS. 11(b) and 11(c), the space between the conductive circuits formed adjacent to each other is larger and thus the capacity between the conductive circuits is reduced. In FIG. 11(c), the dotted straight line (A'-B') is a line tangent to the curved line (A-B) at point (E) and parallel to the dotted straight line (A-B), and point (F) is a midpoint of the curved line (A-B). As shown in FIG. 11(c), the conductive circuit 4 has a cross section such that the midpoint (F) is located closer to the insulation layer 3 than the tangency point (E). On the other hand, if a conductive circuit is formed by a tenting method or a subtractive method, the conductive circuit is made to have a cross section with side lines largely curved inwardly to the extent that the tangency point (E) is located closer to the insulation layer 3 than the midpoint (F). Conductive circuits having side portions etched in such a large amount are not suitable for high-speed signal transmission, and not desirable for making fine patterns, either.

FIGS. 1(a)-7(d) are cross-sectional views of a multilayered PWB during a manufacturing process according to one embodiment of the present invention.

As shown in FIGS. 1(a)-1(c), openings 12 are formed in a metal board 10, and a metal film 13 is formed to cover the entire surface of the metal board 10 including the openings 12, thereby forming a core metal layer.

Metal board 10 may be single-layer or multilayer with two or more layers. As materials for the metal board, metals such as copper, nickel, zinc, aluminum, iron and the like or alloys of such metals are used. If an alloy with a lower thermal expansion ratio such as Alloy 36 or Alloy 42 is used, the thermal expansion ratio of the core substrate is made closer to that of ICs, and stress from heat is reduced. Openings 12 may be bored using punching, etching, drilling or laser. The surface of metal board 10 is coated by metal film 13 formed by using electrolytic plating, electroless plating, substitution plating, sputtering or the like. Openings 12 are preferably treated to round the edge portions. By such treatment, portions where stress accumulates are removed, and formation of cracks around the angular portions is more effectively prevented.

In the step of FIG. 1(d), inner insulation layers 14 are formed to cover the entire surface of the metal film 13 and fill the openings 12, and then inner conductive layers 15 are formed on top of the respective inner insulation layers 14.

As material for inner insulation layers 14, thermosetting resins such as polyimide, epoxy, phenolic, BT and the like may be used, or alternatively, B-stage prepregs made by immersing base material such as glass-cloth, non-woven alamide cloth and the like in such thermosetting resins may be used. One method to form inner insulation layers 14 is to coat both surfaces of metal board 10 with a resin solution, thereby filling openings 12. In addition to the resin solution coating, resin films may be pressed onto both surfaces of metal board 10 by adding heat and pressure. Conductive layers 15 may be made of a metal foil, or alternatively made thick-layered, with two or more metal layers using electrolytic plating, electroless plating or the like.

Then, as illustrated in FIG. 1(*e*), inner conductive circuits 16 including power-source layer (16P) and ground layer (16E) are formed by etching the inner conductive layers 15 using a tenting method.

The inner conductive circuits 16 may be formed by etching, or alternatively formed using an additive method. The thickness of inner layer conductive circuits 16 is preferably in the range of 10-250 μm, and more preferably in the range of 30-100 μm. The reason for this is if the thickness is less than 10 μm, the electric resistance of the conductor becomes higher, and electric power may not be provided instantly when the IC voltage drops, and the driving voltage of the IC may not be instantly resumed. On the other hand, if the thickness exceeds 250 μm, variation in thickness of insulation layers becomes larger due to the height differences between the sections with and without the inner layer conductive circuits 16. Further, the core substrate 32 becomes thicker, and thus loop inductance may not be made smaller.

Through-holes are provided for power source and electrically connected to the power source for electronic devices such as an IC. When the through-holes are provided to pass through ground layer (16E), a wiring pattern extended from the power-source through-holes is preferably not formed. Similarly, through-holes are provided for ground and electrically connected to the ground for electronic devices such as an IC, and when those through-holes are provided to pass through power-source layer (16P), a wiring pattern extended from the ground through-holes is preferably not formed. By forming such a structure, through-hole pitches are made narrower. Also, since the pitches between through-holes and inner conductive circuits are made narrower, mutual inductance is reduced.

In the step of FIG. 2(*a*), outer insulation layers 18 are formed to cover inner conductive circuits 16 and fill the spaces between the inner conductive circuits 16. Then, outer conductive circuits 20 are provided on the outer insulation layers 18.

For example, outer insulation layer 18 and conductive circuits 20 may be formed as follows: a prepreg made by immersing glass-cloth in epoxy resin is deposited on both surfaces of the substrate, a metal foil such as copper is laminated on the outer surfaces of the pregreg, and heat and pressure are added. Accordingly, prepreg resins are filled in the spaces between the conductive circuits, as well as the prepreg and the metal foil being pressed together to become integrated in such a way as to cover both surfaces of conductive circuits 16.

Similar to the process for forming inner insulation layers 14, outer insulation layers 18 may be formed by coating a resin solution to fill the spaces between the inner conductive circuits 16 as well as cover the respective inner conductive circuits 16. Outer insulation layers 18 may also be formed by coating a resin solution, forming a resin film, and attaching the resin film by adding heat and pressure. By forming the outer insulation layers 18 using such a method including adding heat and pressure, the surfaces of the outer insulation layers 18 are made substantially flat.

In the method described above, metal board 10 is used as a core, inner insulation layers 14 and inner conductive circuits 16 are formed on both sides of the metal board 10, and then outer insulation layer 18 and outer conductive circuits 20 are formed. However, instead of using the metal board 10 and providing layers on the metal board 10 as in the above method, a substrate may be formed as follows: a base substrate is prepared by immersing glass-cloth in epoxy resin, copper film is attached on top and bottom surfaces of the base substrate, and the copper film is patterned to form circuits. Also, a multilayer substrate may be formed as follows: a base substrate is prepared by immersing glass-cloth in epoxy resin, copper film is attached on a single surface or both surfaces of the base substrate, the copper film is patterned to form circuits, prepregs and copper films are laminated on outer surfaces of the resultant substrate and pressed together, and the copper films are patterned to form circuits.

In the step of FIG. 2(*b*), through-holes 21 are formed in the substrate of FIG. 2(*a*) with an opening diameter in the range of 50-400 μm. Through-holes 21 are formed in the area corresponding to openings 12 in metal board 10 using either a drilling or laser processing, or using both drilling and laser processing. The shape of the through-holes 21 is preferred to have straight side walls, but if desired, it may be tapered.

FIGS. 2(*c*) and 2(*d*) correspond to the process where plated films 22 are formed on outer conductive circuits 20 as well as on side walls of the through-holes 21, the plated films 22 on the side walls of the through-holes 21 are roughened, and conductive through-hole structure 26 is formed by filling the through-holes 21 with filler 24. In the conductive through-hole structure, the filler 24 is surrounded by the plated film 22.

The plated film 22 provides conductivity to the side walls of through-holes 21. It is preferred that after filler 24 filled in the through-holes 21 is roughly dried, excess filler material adhered to plated film 22 is removed by polishing, and then filler 24 is dried at 150° C. for an hour to harden completely. The plated film 22 is formed using electrolytic plating, electroless plating, panel plating (electroless plating and electrolytic plating) or the like. A metal containing copper, nickel, cobalt, phosphorus or the like is used as the plating metal. The thickness of plated film 22 is preferably in the range of 5-30 μm.

Material for filler 24 may be insulative resin material or conductive resin material. Insulative resin material may be those including, for example, resin materials, hardening agents, particles and other materials, and conductive resin material may be those including resin materials, hardening agents, metal particles such as gold, copper or the like, and other materials. Examples of the insulative resin material include epoxy resins such as bisphenol-based epoxy resins and novolac-based epoxy resins, thermosetting resins such as phenol resins, photosensitive ultraviolet-hardening resins, or thermoplastic resins or the like. Those resin materials may be used singly or in combination. For the particles included in the resin materials, inorganic particles such as silica, alumina or the like, metal particles such as gold, silver, copper or the like, resin particles and others may be used. Those particles may be used singly or by combining multiple kinds of particles. The particle diameter is preferred to be in the range of 0.1-5 μm. Particles with the same diameter or with different diameters may be mixed and used. Examples of the hardening agents include an imidazole-based hardening agent, an amine-based hardening agent and others. A hardening stabilizer, reaction stabilizer or particles may also be included. As the conductive resin material, a conductive paste made by adding metal particles, hardening agents and others to resin is used. Also, instead of using a conductive paste, through-holes 21 may be filled with plating material. If the holes are filled with plating material, their surfaces do not form hollows when the conductive paste is hardened and shrunk.

In the steps of FIGS. 3(a) and 3(b), a plating film is formed entirely on both sides of the substrate of FIG. 2(d) and patterned to provide sealing layers 28 and outer conductive circuits 30 including power-source layer (30P) and ground layer (30E), thereby forming multilayered core substrate 32. The sealing layers 28 are formed at portions right above the conductive through-hole structures 26, respectively. The sealing layers 28 and outer conductive circuits 30 are formed by, for example, applying an etching process using a tenting method. The thickness of the outer conductive circuits 30 is preferably in the range of 10-75 μm and more preferably in the range of 20-40 μm. The reasons for that range are: if the thickness is less than 10 the electric resistance of the conductor becomes larger; and if the thickness exceeds 75 μm, it may be more difficult to level the surface of interlayer insulation layers to be formed on the core substrate, or the core substrate itself will become thicker.

The above steps produce multilayered core substrate 32 in which outer conductive circuits 30 provided on outer surfaces of the multilayered core substrate 32 are electrically connected via conductive through-hole structures 26, and inner conductive circuits 16 and outer conductive circuits 30 are also electrically connected via the conductive through-hole structures 26.

Then, as illustrated in FIG. 3(c), roughened surfaces 34 are formed on the side and top surfaces of outer conductive circuits 30, including through-hole land surfaces, by applying, for example, black oxide and reduction treatments on both surfaces of multilayered core substrate 32.

FIG. 4(a) corresponds to the process in which filler 36 is filled in the areas where outer conductive circuits 30 are not formed on the multilayered core substrate 32, namely, in the spaces between outer conductive circuits 30. Material for filler 36 may be the same as filler 24 used to fill in through-holes 21.

In the step of FIG. 4(b), roughened surface 34 formed on one side of the multilayered core substrate 32 is removed by a sanding process using a belt sander or the like. The sanding process is performed so that filler 36 does not remain in outer peripheral portions of outer conductive circuits 30. Then, to remove the scratches resulting from the above sanding, top surfaces of outer conductive circuits 30 are sanded using a buff or the like. The same sanding procedure is conducted on the other side of the multilayered core substrate 32 to smooth out the surface. Then, filler 36 is hardened after heat treatments, for instance, at 100° C. for an hour and 150° C. for an hour.

The step to fill the filler 36 in spaces between outer conductive circuits 30 may be omitted if desired. In such a case, resin material of interlayer insulation layers laminated on the multilayered core substrate 32 may be used to form the interlayer insulation layers and to fill in the spaces between the outer conductive circuits 30 at the same time.

Next, as illustrated in FIG. 4(c), roughened layers 38 are formed by spraying an etching solution on surfaces of outer conductive circuits (30) including power-source layer (30P) and ground layer (30E) and land surfaces of the through-holes 21, which are smoothed in the previous step.

Figure 5B:
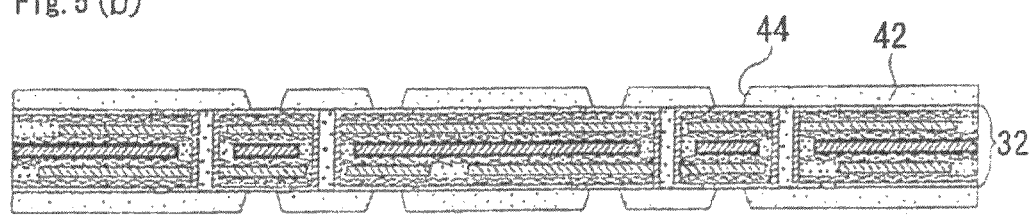

FIGS. 5(a) and 5(b) show processes in which insulation films 40 are disposed on roughened layers 38, first interlayer insulation layers 42 are formed, and then via-hole openings 44 are formed in the first interlayer insulation layers 42. The first interlayer insulation layers 42 are formed by placing the insulation films 40 on the roughened layers 38, preliminarily pressing and cutting the insulation film 40, and then attached to the roughened layers 38 using vacuum laminator equipment. Next, via-hole openings 44 are formed in the first interlayer insulation layers 42 using, for example, a $CO_2$ gas laser.

Figure 5C:
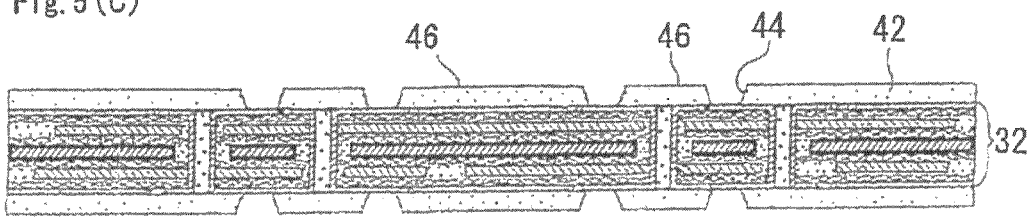

In the step of FIG. 5(c), surfaces of first interlayer insulation layers 42 are roughened, including surfaces of inner walls of the via-hole openings 44. Roughened layers 46 are formed by a treatment including, for example, immersing the multilayered core substrate 32 in a swelling solution, washing with water and immersing in a solution containing permanganic acid. In this treatment, scalelike particles dispersed among the hardening resin in the first interlayer insulation layers 42 are pulled away from the surfaces of the first interlayer insulation layers 42. After this treatment, the multilayered core substrate 32 may be immersed in a neutralizer and washed with water. Desmear treatment may be conducted to remove remaining resin and particles at the bottom of via-hole openings 44 using physical methods such as $O_2$ plasma, $CF_4$ plasma or the like. Then, catalytic cores are adhered to surfaces of first interlayer insulation layers 42 and inner walls of via-hole openings 44 by, for example, depositing a palladium catalyst on surfaces of the multilayered core substrate 32 having roughened layers 46.

Figure 5D:
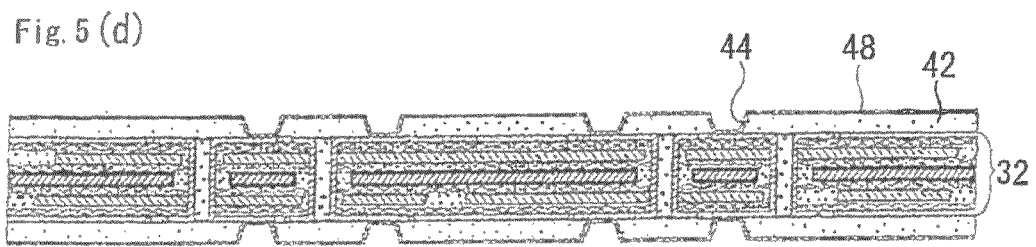
Figure 6:
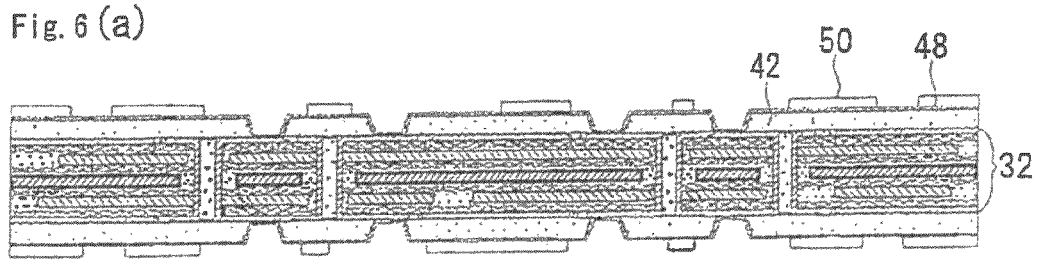
FIGS. 6(a)-6(d) are cross-sectional views of the multilayered PWB during the manufacturing process.
Figure 6:
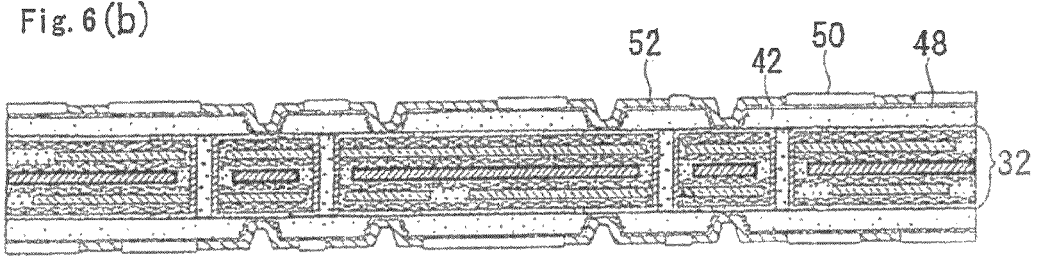
Figure 6:
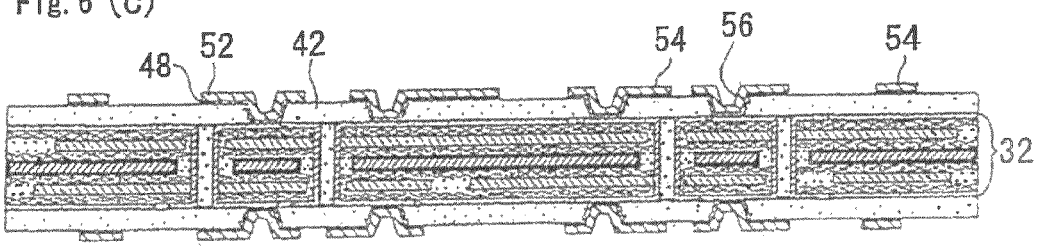
Figure 6:
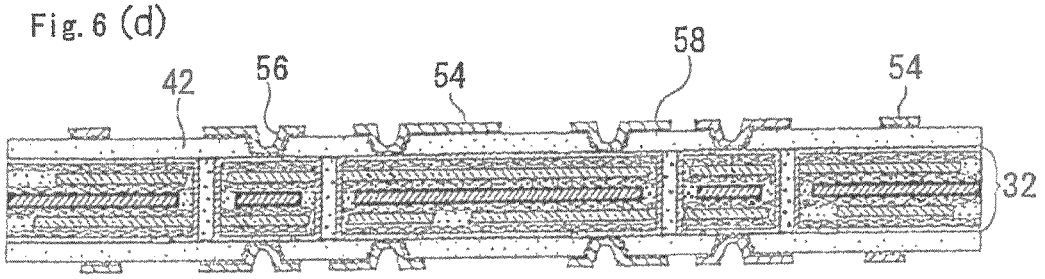

FIG. 5(d) corresponds to the process in which electroless plated films 48 are formed on the entire surfaces of the roughened layers 46, including surfaces of the inner walls of via-hole openings 44.

In the step of FIG. 6(a), plated resists 50 are provided on portions of the electroless plated films 48. To form the plated resists 50, for example, brand name "NIT225" and "NIT215" made by Nichigo Morton Co., Ltd., or photosensitive resin composition described in Japanese Patent Laid-Open Publication 2004-317874, may be used. The contents of this publication are incorporated herein by reference in their entirety.

In the steps of FIGS. 6(b) and 6(c), the multilayered core substrate 32 is subject to electrolytic plating to form plating films 52 in portions of the multilayered core substrate 32 where plated resists 50 are not provided, and then independent conductive circuits 54 and via-holes 56 are formed by removing plated resists 50 and electroless plated films 48 provided under the plated resists 50. The conductive circuits 54 are formed to have substantially trapezoidal shapes as described below in more detail.

Next, as illustrated in FIG. 6(d), a surface-roughening treatment is applied to form roughened surfaces 58 on conductive circuits 54 and via-holes 56, including side surfaces of the conductive circuits 54 and via-holes 56. Surface-roughening treatment includes, for example, roughening by an etching treatment using brand name "MECetchBOND CZ-8100" made by MEC Co., Ltd. or a black oxide treatment. The roughened surfaces 58 are preferably formed at least on side surfaces of the conductive circuits 54.

Figure 7A:
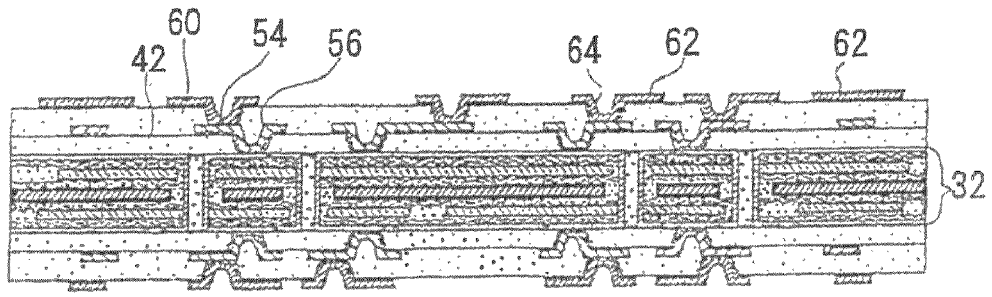
FIGS. 7(a)-7(d) are cross-sectional views of the multilayered PWB during the manufacturing process.

In the step of FIG. 7(a), second interlayer insulation layers 60 are formed on roughened surfaces 58, and then top-layer conductive circuits 62 and via-holes 64 are formed on the second interlayer insulation layers 60 to obtain a multilayered PWB.

Figure 7B:
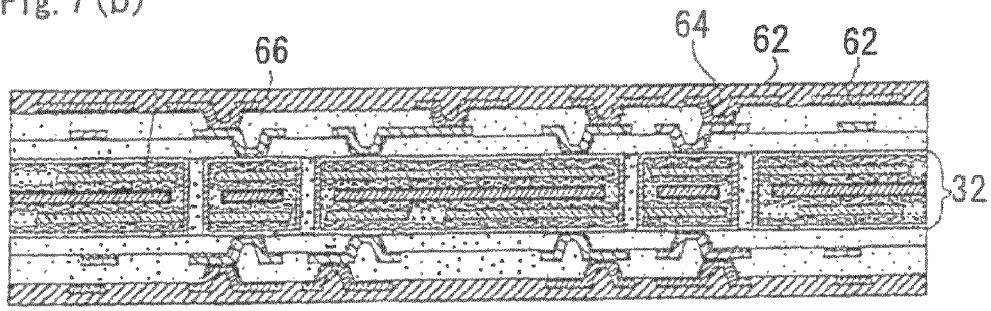
Figure 7C:
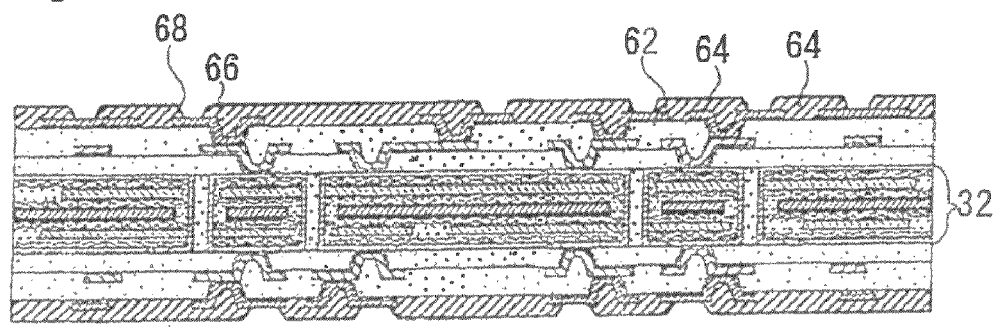

Then, in the steps of FIGS. 7(b) and 7(c), solder-resist layers 66 are formed on surfaces of the multilayered PWB, and openings 68 are formed in the solder-resist layers 66. Through the openings 68, portions of the top-layer conductive circuits 62 are exposed. The solder-resist layers 66 are formed by, for example, coating an off-the-shelf solder-resist composition in a thickness of 12-30 μm and then dried at 70° C. for 20 minutes and 70° C. for 30 minutes.

Figure 7D:
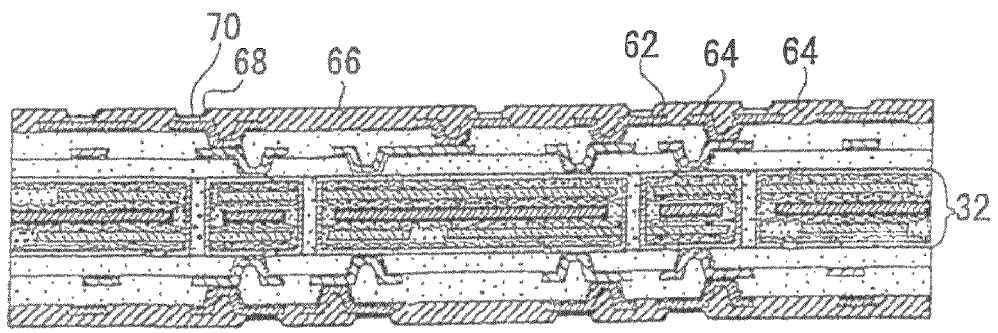

FIG. 7(d) corresponds to a process of forming conductive layers 70 on the exposed portions of the top-layer conductive circuits 62. The conductive layers 70 are, for example, nickel-gold layers made by forming a nickel-plated layer and a gold-plated layer on the nickel-plated layer. Other than nickel-gold layers, a single layer may be formed as the conductive layer 70 using tin or noble metals such as gold, silver, palladium, platinum and others.

FIG. 8 shows the PWB with solder bumps 72. For example, the solder bumps 72 are provided as follows: a tin-lead solder paste is printed on the surface of top-layer conductive circuits 62, exposed through openings 68 in solder-resist layer 66, and a tin-antimony solder paste is printed on the other surface. Then, the substrate is put through a reflow process to form external terminals, and a multilayered PWB having solder bumps 72 is formed.

Then, as illustrated in FIG. 9, IC chip 74 and chip capacitors 76 are mounted on the multilayered PWB via solder bumps 72, and the multilayered PWB with the mounted IC chip 74 and chip capacitors 76 is installed on mother board 80 through external terminals 78.

The following Examples 1-40 are examples of the multilayered PWB according to one embodiment of the present invention and a manufacturing method of the multilayered PWB. Reference Examples 1-15 and Comparative Examples 1-15 are presented below for comparison purposes.

Example 1

(A) Preparation of a Kneaded Mixture Containing Scalelike Particles

Scalelike particles 15 g (brand name "S-BEN C", made by HOJUN, aspect ratios when dispersed: ~500, and crystal size: ~0.5 μm) were added to a mixed solvent of methylethyl ketone (hereinafter referred to as MEK) 20 g and xylene 80 g. Then the mixture was kneaded with three rollers and the kneaded mixture containing scalelike particles was prepared.

(B) Preparation of a Solution Containing Epoxy-Resin

Solid epoxy-resin 85 g (brand name "Epicoat 1007", made by Japan Epoxy Resins Co., Ltd., was added to a mixed solvent of MEK 6.8 g and xylene 27.2 g and mixed to make a solution containing epoxy-resin.

(C) Preparation of Resin Film for Interlayer Insulation Layer

The kneaded mixture containing scaled particles prepared in above (A), the solution containing epoxy-resin prepared in above (B), dicyanide diamide as a hardening agent (brand name "CG-1200", made by BTI Japan Ltd.) used 3.3 g per 100 g of solid epoxy-resin, and a hardening catalyst (brand name "Curezol 2E4 HZ", made by Shikoku Chemicals Corp.) used 3.3 g per 100 g of solid epoxy-resin, were kneaded with three rollers to prepare a bonding solution.

The bonding solution was coated on a polyethylene terephthalate sheet using a roll coater (made by Cermatronics Boeki Co., Ltd.), then heated and dried at 160° C. for five minutes to remove the solvent and a 40 μm-thick insulation film was prepared.

When scalelike particles contained in the insulation film were observed using a transmission electron microscope (50,000 to 100,000 power), the smallest crystal size when dispersed (the smallest width or the shortest length of a particle, whichever is smaller) was 0.1 μm. Thus, the aspect ratios of the scalelike particles of this example were 100-500.

(D) Manufacturing a Multilayered PWB (1) Forming a Core Metal Layer

In a 100 μm-thick board made of Alloy 42 (42 Ni+Fe), openings passing through from front to back of the board were formed by punching. The entire surface of the metal board including the openings was coated by copper film using electroless plating to form a core metal layer.

(2) Forming Inner Insulation Layer and Conductive Layer

An inner insulation layer was formed, covering the entire surface of the core metal layer, where the openings were formed, as well as filling the openings. Then, conductive layer 15 was formed on top of the insulation layer. More specifically, the insulation layer and conductive layer were formed as follows: an approximately 200 μm-thick prepreg, made by immersing glass-cloth in epoxy resin, was provided to cover the core metal layer. Then, after a 60 μm-thick copper foil is laminated on top of the prepreg, heat and pressure were added to the metal foil. The prepreg and the metal foil were pressed together to be integrated in such a way that the prepreg resin fills the openings and covers the core metal layer.

(3) Forming Inner Layer Conductive Circuits

Inner layer conductive circuits, having power-source layer (16P) and ground layer (16E), were formed by etching inner conductive layer 15 using a tenting method. In this example, the thickness of the inner conductive circuits 16 was 60 μm.

(4) Forming Outer Insulation Layers and Outer Conductive Circuits

Similar to the above step (2), outer insulation layer was formed to cover inner conductive circuits and fill the spaces between the circuits. Then, outer conductive circuits were formed on the insulation layer.

More specifically, the outer insulation layer and outer conductive circuits were formed as follows: a prepreg approximately 200 μm thick, made by immersing glass-cloth in epoxy resin, was disposed on both surfaces of the substrate formed in the above steps (1)-(3). After laminating a metal foil made of 35 μm-thick copper on the outer surfaces of the pregreg, heat and pressure were added. Accordingly, prepreg resins were filled in the spaces between the inner conductive circuits, as well as the prepreg and the metal foil being pressed together to become integrated in such a way as to cover both surfaces of the inner conductive circuits.

(5) Forming Through-Holes for Through-Hole Conductors

Through-holes to pass through the core substrate prepared in the above step (4) were formed with an opening diameter of 250 μm. Through-holes 21 were formed in the area corresponding to the openings in metal board using drilling. The through-holes were made to have straight side walls.

(6) Forming Through-Hole Conductors

To give conductivity to the side walls of the through-holes formed in the above step (5), a copper plated film was formed on the side walls by panel plating (electroless plating and electrolytic plating), and the surfaces of plated film were roughened. Then, filler was filled in the through-holes and roughly dried, excess filler on plated film was removed by sanding, and the filler was dried at 150° C. for an hour to harden completely, thereby forming through-hole conductors were made.

The thickness of the plated film 22 was 20 μm. Material for the filler was epoly resin including imidazole-based hardening agent and silica particles. The particle diameter was 3 μm.

(7) Forming Outer Conductive Layers and Conductive Circuits on the Core Substrate A plating film was coated entirely on both surfaces of the substrate having through-hole conductors formed in the above step (6). Then, sealing layer was formed by plating directly on top of the through-hole conductors by applying an etching process using a tenting method, and outer conductive circuits having power-source layer and ground layer were formed as well. The thickness of outer conductive circuits was 35 μm in the present example.

By following the above steps (1)-(7), a multilayered core substrate is formed, in which outer conductive circuits on both outer surfaces of the substrate are electrically connected via through-hole conductors, and inner conductive circuits and outer conductive circuits are also electrically connected via through-hole conductors.

(8) Roughened Surfaces of Outer Conductive Circuits

By applying black oxide and reduction treatments on both surfaces of the multilayered core substrate, roughened surfaces were formed on the side and top surfaces of outer conductive circuits, including surfaces of through-hole lands.

(9) Forming First Interlayer Insulation Layers

A resin film prepared in the above step (C) was disposed on the surfaces of the outer conductive circuit on which the roughened layer was formed. The resin film was then preliminarily pressed and cut, then laminated on the substrate surface using vacuum laminator equipment to form first interlayer insulation layers.

(10) Forming Openings for the Formation of Via-Holes

Via-hole openings with diameters of 60 μm were formed in the interlayer insulation layer using a $CO_2$ gas laser.

(11) Forming Roughened Layers

The multilayer core substrate having the above via-hole openings was immersed in a swelling solution, washed with water and immersed in a solution containing permanganic acid 60 g/L at 80° C. for 10 minutes. Accordingly, scalelike particles dispersed among the hardening resin in the first interlayer resin insulation layer were dropped from the interlayer insulation layer surfaces, and roughened surfaces were formed on the surfaces of the first interlayer resin insulation layer, including the inner walls of the via-hole openings. The roughness (Ra) of roughened layer was 0.2 μm.

(12) Providing Catalytic Cores

After the above treatment, the multilayer core substrate was immersed in a neutralizer (made by Shipley Co. LLC) and washed with water. Desmear treatment was conducted to remove remaining resin and particles at the bottom of via-holes using $O_2$ plasma.

By depositing a palladium catalyst on surfaces of the substrate after roughened treatment, catalytic cores were adhered to surfaces of the first interlayer resin insulation layer and inner walls of the via-hole openings.

(13) Forming Electroless Copper Plating Films

After the catalyst was adhered in the above step (15), the multilayer core substrate was immersed in an electroless copper plating solution with the composition shown below. Electroless copper plated film with a thickness of 0.8 μm was formed on the entire surfaces of roughened layer. Accordingly, a substrate was prepared with conductive layers formed on surfaces of the first interlayer resin insulation layer, including inner walls of the via-hole openings.

| (electroless copper plating solution) | |
|---|---|
| copper sulfate: | 0.03 mol/l |
| EDTA: | 0.200 mol/l |
| HCHO: | 0.18 g/l |
| NaOH: | 0.100 mol/L |
| α,α'-bipyridyl: | 100 mg/l |
| polyethylene glycol | 0.10 g/l |
| (plating conditions) | |
| solution temperature at 34° C. for 40 minutes | |

(14)

After electroless copper plating film was formed, an off-the-shelf photosensitive alkaline-based liquid etching ink (PER-20 series, made by Taiyo Ink Mfg. Co. Ltd.) was coated on the substrate and roughly dried. Then, a mask was placed on the film, which was then exposed to light and developed to form plated resist with a thickness of 10 μm. The portions which later become signal lines were formed to satisfy (L/S)=5/5 μm.

(15)

Then, electrolytic plating was applied to the multilayer core substrate to form electrolytic copper plating film in the portion where the plated resist was not formed. In this example, a 7.5 μm-thick electrolytic copper plated film was formed using the plating solution and the conditions shown below.

| (electrolytic copper plating solution) | |
|---|---|
| sulfuric acid: | 2.24 mol/l |
| copper sulfate: | 0.26 mol/l |
| additive: | 19.5 ml/l (Cupracid GL, made by Atotec Japan) |
| (electrolytic plating conditions) | |
| electric current density: | 1 A/dm$^2$ |
| time: | 35 ± 5 minutes |
| temperature: | 22 ± 2° C. |

(16)

After exfoliating and removing the plated resist, the electroless plating film under the plated resist was dissolved and removed using the below etching method to form independent conductive circuits and via-holes.

Among the signal wirings set as (L/S)=5/5 μm (both (L) and (S) indicate spaces on interlayer insulation layers), five signal wirings were aligned approximately parallel; the first, third and fifth wirings were connected to the IC, and the second and fourth wirings were set for measurement without being connected to the IC (they will be the testing wirings used in Evaluation Test 1 described later).

(Etching Method)

Substrates for PWBs were taken to an etching treatment zone, and horizontal-transport etching equipment was used for the treatment. The horizontal-transport etching equipment has a conveyor belt to transport the substrates through the etching treatment zone and spray nozzles to spray an etching solution on both top and bottom of the substrates for PWBs, with multiple levels of adjustable spray pressures.

In this example, etching was conducted using slit nozzles, while the nozzles are moving in a sweeping motion, to form conductive circuits with slanting side portions and conductive circuits in a trapezoidal shape.

| (etching conditions) | |
| --- | --- |
| distance between nozzle and work: | 50 mm |
| spraying pressure: | 0.05 Mpa-0.3 MPa |
| etching solution: | Copper (II) Chloride |
| etching temperature: | 45° C. |
| etching time: | 10-60 seconds |

In this example, slit nozzles were used, etching time was set for 10 seconds, the surface to be etched was placed upward and only the nozzles installed at the upper section of the etching equipment were used. After etching, the thickness of the conductive circuits (T) was adjusted to be 5 μm by surface sanding.

(17)

Next, a surface-roughening treatment was applied, and the surfaces (including the sides) of conductive circuits and via-holes became roughened surface. Surface-roughening treatment was performed by an etching treatment using brand name "MECetchBOND CZ-8100" made by MEC Co., Ltd.

Another substrate, which was the same as the above, was prepared according to the above steps (1)-(17), and a section to measure |W1–W2| was bored using punching or the like to make the substrate a sample for measurement.

The conductive circuits and vertical cross-sections between conductive circuits were sanded for observation purposes. After the sanded portions were observed and photographed using an SEM (Scanning Electron Microscope) with 100-3,500 power, the finished line width (W1) (upper conductive circuit spaces) and (W2) (lower conductive circuit spaces) were measured with a gauge.

As a result, |W1–W2| values at the above-described eight points, the same data-pickup points to calculate deviations (σ), ranged from 0.5 μm (the smallest value measured among the eight points) to 1.75 μm (the largest value measured among the eight points) and fell substantially in the range of 0.10T-0.35T with reference to conductive circuit thickness (T) as shown in Table 1. The deviation (σ) of |W1–W2| was 1.23 μm.

(18)

On the substrate on which roughened surface was formed in the above step (17), second interlayer resin insulation layer was formed by repeating the above steps (9)-(17). Further, on the second interlayer resin insulation layer, top-layer conductive circuits and via-holes were formed to obtain a multilayered PWB.

(19) Forming Solder-Resist Layers

On both surfaces of the multilayered PWB prepared in the above step (18), an off-the-shelf solder-resist composition was coated and then dried at 70° C. for 20 minutes and 70° C. for 30 minutes to form solder-resist layer. Then, a 5 mm-thick photo-mask with a pattern of solder-resist openings was adhered to the solder-resist layer, which was then exposed to ultraviolet light at 1,000 mJ/cm² and developed in a DMTG solution, to form openings with a diameter of 200 μm.

Furthermore, the solder-resist layer was heat-processed at 80° C. for an hour, 100° C. for an hour, 120° C. for an hour and 150° C. for three hours to harden the layers. Accordingly a solder-resist pattern was formed with a thickness of 15 μm, and having openings, through which the surface of top-layer conductive circuits was exposed.

(20) Forming a Nickel-Gold Layer

The substrate with the solder-resist pattern was immersed in an electroless nickel plating solution, and a 5 μm-thick nickel-plated layer was formed on the surface of top-layer conductive circuits exposed through openings. Then, after the substrate was further immersed in an electroless gold-plating solution to form a 0.03 μm-thick gold-plated layer on the nickel-plated layer, nickel-gold layer 70 was achieved.

(21) Forming Solder Bumps

A tin-lead solder paste was printed on the surface of top-layer conductive circuits, exposed through openings in solder-resist layer, which were formed on one surface of the substrate (the surface on which to mount an IC chip), and a tin-antimony solder paste was printed on the other surface. After the substrate was put through a reflow process at 200° C. to form external terminals, a multilayered PWB having solder bumps was achieved.

On the above multilayered PWB, IC chip was mounted via solder bumps and chip capacitors were also mounted. The multilayered PWB with a mounted IC chip and chip capacitors was installed on a mother board through external terminals.

Example 2

A multilayered PWB was manufactured according to the same procedure as in Example 1, except the (L/S) of signal lines was made 7.5 μm/7.5 μm and the conductive circuit thickness (T) was made 7.5 μm by changing a mask to form plated resist patterns, electrolytic copper-plating conditions and the conductive circuit thickness after adjustments were made to the film thickness.

The value of |W1–W2| in this example was in the range of 0.675 μm-2.775 μm and fell substantially in the range of 0.10T-0.35T with reference to the conductive circuit thickness (T). The deviation (σ) of |W1–W2| was 1.33 μm.

Example 3

A multilayered PWB was manufactured according to the same procedure as in Example 1, except the (L/S) of signal lines was made 10.0 μm/10.0 μm and the conductive circuit thickness (T) was made 10.0 μm by changing a mask to form plated resist patterns, electrolytic copper-plating conditions and the conductive circuit thickness after adjustments were made to the film thickness.

The value of |W1–W2| in this example was in the range of 0.9 μm-3.6 μm and fell substantially in the range of 0.10T-0.35T with reference to the conductive circuit thickness (T). The deviation (σ) of |W1–W2| was 1.27 μm.

Example 4

A multilayered PWB was manufactured according to the same procedure as in Example 1, except the (L/S) of signal lines was made 12.5 μm/12.5 μm and the conductive circuit thickness (T) was made 12.5 μm by changing a mask to form plated resist patterns, electrolytic copper-plating conditions and the conductive circuit thickness after adjustments were made to the film thickness.

The value of |W1–W2| in this example was in the range of 1.25 μm-4.375 μm and fell substantially in the range of 0.10T-0.35T with reference to the conductive circuit thickness (T). The deviation (σ) of |W1–W2| was 1.34 μm.

Example 5

A multilayered PWB was manufactured according to the same procedure as in Example 1, except the (L/S) of signal lines was made 15.0 μm/15.0 μm and the conductive circuit thickness (T) was made 15.0 μm by changing a mask to form plated resist patterns, electrolytic copper-plating conditions and the conductive circuit thickness after adjustments were made to the film thickness.

The value of |W1−W2| in this example was in the range of 1.35 μm-5.25 μm and fell substantially in the range of 0.10T-0.35T with reference to the conductive circuit thickness (T). The deviation (σ) of |W1−W2| was 1.35 μm.

Example 6

A multilayered PWB was manufactured according to the same procedure as in Example 1, except the etching time was changed to 30 seconds.

The value of |W1−W2| in this example was in the range of 1.7 μm-3.7 μm and fell substantially in the range of 0.35T-0.73T with reference to the conductive circuit thickness (T). The deviation (σ) of |W1−W2| was 1.77 μm.

Example 7

A multilayered PWB was manufactured according to the same procedure as in Example 2, except the etching time was changed to 30 seconds.

The value of |W1−W2| in this example was in the range of 2.475 μm-5.475 μm and fell substantially in the range of 0.35T-0.73T with reference to the conductive circuit thickness (T). The deviation (σ) of |W1−W2| was 1.76 μm.

Example 8

A multilayered PWB was manufactured according to the same procedure as in Example 3, except the etching time was changed to 30 seconds.

The value of |W1−W2| in this example was in the range of 3.5 μm-7.3 μm and fell substantially in the range of 0.35T-0.73T with reference to the conductive circuit thickness (T). The deviation (σ) of |W1−W2| was 1.78 μm.

Example 9

A multilayered PWB was manufactured according to the same procedure as in Example 4, except the etching time was changed to 30 seconds.

The value of |W1−W2| in this example was in the range of 4.25 μm-9.25 μm and fell substantially in the range of 0.35T-0.73T with reference to the conductive circuit thickness (T). The deviation (σ) of |W1−W2| was 1.65 μm.

Example 10

A multilayered PWB was manufactured according to the same procedure as in Example 5, except the etching time was changed to 30 seconds.

The value of |W1−W2| in this example was in the range of 5.25 μm-10.95 μm and fell substantially in the range of 0.35T-0.73T with reference to the conductive circuit thickness (T). The deviation (σ) of |W1−W2| was 1.72 μm.

Example 11

A multilayered PWB was manufactured according to the same procedure as in Example 1, except the etching method was changed as follows.

Compared with Example 1, the etching treatment was conducted twice. The first etching was processed the same as in Example 1. Then, among the four locations of the PWB divided for the purpose of obtaining data, two locations were covered with Kapton tape or the like. The uncovered locations were etched for 20 seconds using slit nozzles with sweeping motions, and the Kapton tape or the like was peeled off. The type of nozzles used and the direction of the etched surface in the above etching were the same as in Example 1.

The value of |W1−W2| in this example was in the range of 0.5 μm-3.65 μm and fell substantially in the range of 0.10T-0.73T with reference to the conductive circuit thickness (T). The deviation (σ) of |W1−W2| was 2.01 μm.

Example 12

A multilayered PWB was manufactured according to the same procedure as in Example 2, except the etching procedure followed the procedure in Example 11.

The value of |W1−W2| in this example was in the range of 0.675 μm-5.625 μm and fell substantially in the range of 0.10T-0.73T with reference to the conductive circuit thickness (T). The deviation (σ) of |W1−W2| was 2.13 μm.

Example 13

A multilayered PWB was manufactured according to the same procedure as in Example 3, except the etching procedure followed the procedure in Example 11.

The value of |W1−W2| in this example was in the range of 0.9 μm-7.6 μm and fell substantially in the range of 0.10T-0.73T with reference to the conductive circuit thickness (T). The deviation (σ) of |W1−W2| was 2.2 μm.

Example 14

A multilayered PWB was manufactured according to the same procedure as in Example 4, except the etching procedure followed the procedure in Example 11.

The value of |W1−W2| in this example was in the range of 1.25 μm-9.25 μm and fell substantially in the range of 0.10T-0.73T with reference to the conductive circuit thickness (T). The deviation (σ) of |W1−W2| was 2.45 μm.

Example 15

A multilayered PWB was manufactured according to the same procedure as in Example 5, except the etching procedure followed the procedure in Example 11.

The value of |W1−W2| in this example was in the range of 1.5 μm-10.95 μm and fell substantially in the range of 0.10T-0.73T with reference to the conductive circuit thickness (T). The deviation (σ) of |W1−W2| was 2.58 μm.

Example 16

A multilayered PWB was manufactured according to the same procedure as in Example 1, except roughened surfaces were not formed on the surfaces of conductive circuits and via-holes in the step (17).

(W1) and (W2) were measured after the conductive circuits were formed.

Example 17

A multilayered PWB was manufactured according to the same procedures as in Example 2, except roughened surfaces were not formed on the surfaces of conductive circuits and via-holes in the step (17).

Example 18

A multilayered PWB was manufactured according to the same procedure as in Example 3, except roughened surfaces were not formed on the surfaces of conductive circuits and via-holes in the step (17).

Example 19

A multilayered PWB was manufactured according to the same procedure as in Example 4, except roughened surfaces were not formed on the surfaces of conductive circuits and via-holes in the step (17).

Example 20

A multilayered PWB was manufactured according to the same procedure as in Example 5, except roughened surfaces were not formed on the surfaces of conductive circuits and via-holes in the step (17).

Example 21

A multilayered PWB was manufactured according to the same procedure as in Example 6, except roughened surfaces were not formed on the surfaces of conductive circuits and via-holes in the step (17).

Example 22

A multilayered PWB was manufactured according to the same procedure as in Example 7, except roughened surfaces were not formed on the surfaces of conductive circuits and via-holes in the step (17).

Example 23

A multilayered PWB was manufactured according to the same procedure as in Example 8, except roughened surfaces were not formed on the surfaces of conductive circuits and via-holes in the step (17).

Example 24

A multilayered PWB was manufactured according to the same procedure as in Example 9, except roughened surfaces were not formed on the surfaces of conductive circuits and via-holes in the step (17).

Example 25

A multilayered PWB was manufactured according to the same procedure as in Example 10, except roughened surfaces were not formed on the surfaces of conductive circuits and via-holes in the step (17).

Example 26

A multilayered PWB was manufactured according to the same procedure as in Example 11, except roughened surfaces were not formed on the surfaces of conductive circuits and via-holes in the step (17).

Example 27

A multilayered PWB was manufactured according to the same procedure as in Example 12, except roughened surfaces were not formed on the surfaces of conductive circuits and via-holes in the step (17).

Example 28

A multilayered PWB was manufactured according to the same procedure as in Example 13, except roughened surfaces were not formed on the surfaces of conductive circuits and via-holes in the step (17).

Example 29

A multilayered PWB was manufactured according to the same procedure as in Example 14, except roughened surfaces were not formed on the surfaces of conductive circuits and via-holes in the step (17).

Example 30

A multilayered PWB was manufactured according to the same procedure as in Example 15, except roughened surfaces were not formed on the surfaces of conductive circuits and via-holes in the step (17).

Reference Example 1

A multilayered PWB was manufactured according to the same procedure as in Example 14, except the second etching process was conducted not by using slit nozzles, but by immersion for one minute in the same etching solution as was used in the first etching process.

The value of |W1−W2| in this reference example was in the range of 1.25 µm-9.25 µm and fell substantially in the range of 0.10T-0.73T with reference to the conductive circuit thickness (T). However, since this example also employed the immersion etching process where the etching solution does not flow, etching speeds were significantly different depending on the etched portions, and accordingly circuit configurations of wiring circuits were considerably different from each other. As a result, the deviation ($\sigma$) of |W1−W2| was 2.58 µm.

Reference Example 2

A multilayered PWB was manufactured according to the same procedure as in Reference Example 1, except roughened surfaces were not formed after forming conductive circuits.

Comparative Example 1

A multilayered PWB was manufactured according to the same procedure as in Example 16, except slit nozzles did not make sweeping motions. As a result, the cross-sections of conductive circuits were rectangular.

Comparative Example 2

A multilayered PWB was manufactured according to the same procedure as in Example 17, except slit nozzles did not make sweeping motions. As a result, the cross-sections of conductive circuits were rectangular.

Comparative Example 3

A multilayered PWB was manufactured according to the same procedure as in Example 18, except slit nozzles did not make sweeping motions. As a result, the cross-sections of conductive circuits were rectangular.

Comparative Example 4

A multilayered PWB was manufactured according to the same procedure as in Example 19, except slit nozzles did not make sweeping motions. As a result, the cross-sections of conductive circuits were rectangular.

Comparative Example 5

A multilayered PWB was manufactured according to the same procedure as in Example 20, except slit nozzles did not make sweeping motions. As a result, the cross-sections of conductive circuits were rectangular.

Comparative Example 6

A multilayered PWB was manufactured according to the same procedure as in Example 16, except the etching time was changed from 30 seconds to 50 seconds.

The value of |W1−W2| in this comparative example was in the range of 3.9 μm-4.3 μm and fell in the range of 0.78T-0.86T with reference to the conductive circuit thickness (T). The deviation (σ) of |W1−W2| was 1.58 μm.

Comparative Example 7

A multilayered PWB was manufactured according to the same procedure as in Example 17, except the etching time was changed from 30 seconds to 50 seconds.

The value of |W1−W2| in this comparative example was in the range of 6.075 μm-6.6 μm and fell in the range of 0.81T-0.88T with reference to the conductive circuit thickness (T). The deviation (σ) of |W1−W2| was 1.78 p.m.

Comparative Example 8

A multilayered PWB was manufactured according to the same procedure as in Example 18, except the etching time was changed from 30 seconds to 50 seconds.

The value of |W1−W2| in this comparative example was in the range of 7.7 μm and fell in the range of 0.77T-0.86T with reference to the conductive circuit thickness (T). The deviation (σ) of |W1−W2| was 1.62 μm.

Comparative Example 9

A multilayered PWB was manufactured according to the same procedure as in Example 19, except the etching time was changed from 30 seconds to 50 seconds.

The value of |W1−W2| in this comparative example was in the range of 9.625 μm-10.875 μm and fell in the range of 0.77T-0.87T with reference to the conductive circuit thickness (T). The deviation (σ) of |W1−W2| was 1.73 μm.

Comparative Example 10

A multilayered PWB was manufactured according to the same procedure as in Example 20, except the etching time was changed from 30 seconds to 50 seconds.

The value of |W1−W2| in this comparative example was in the range of 12 μm-12.75 μm and fell in the range of 0.8T-0.85T with reference to the conductive circuit thickness (T). The deviation (σ) of |W1−W2| was 1.88 μm.

Comparative Example 11

A multilayered PWB was manufactured according to the same procedure as in Example 16, except the etching time was 5 seconds.

Comparative Example 12

A multilayered PWB was manufactured according to the same procedure as in Example 17, except the etching time was 5 seconds.

Comparative Example 13

A multilayered PWB was manufactured according to the same procedure as in Example 18, except the etching time was 5 seconds.

Comparative Example 14

A multilayered PWB was manufactured according to the same procedures as in Example 19, except the etching time was 5 seconds.

Comparative Example 15

A multilayered PWB was manufactured according to the same procedure as in Example 20, except the etching time was 5 seconds.

Reference Example 3

A multilayered PWB was manufactured according to the same procedure as in Comparative Example 11, except roughened surfaces were formed on the surfaces of conductive circuits.

Reference Example 4

By changing a mask to form plated resist patterns as well as adjusting electrolytic copper-plating conditions and the conductive circuit thickness after sanding in Example 1, the (L/S) of signal lines was made 20.0 μm/20.0 μm and the conductive circuit thickness (T) was made 20 μm. Also, slit nozzles did not make sweeping motions. As a result, the cross-sections of conductive circuits were rectangular.

Reference Example 5

By changing a mask to form plated resist patterns as well as adjusting electrolytic copper-plating conditions and the conductive circuit thickness after sanding in Example 16, the (L/S) of signal lines was made 20.0 μm/20.0 μm and the conductive circuit thickness (T) was made 20 μm. Also, slit nozzles did not make sweeping motions. As a result, the cross-sections of conductive circuits were rectangular.

Reference Example 6

By changing a mask to form plated resist patterns as well as adjusting electrolytic copper-plating conditions and the conductive circuit thickness after sanding in Example 1, the (L/S)

of signal lines was made 20.0 μm/20.0 μm and the conductive circuit thickness (T) was made 20 μm. Also, the etching time was changed from 30 seconds to 50 seconds. As a result, the value of |W1−W2| in this reference example was in the range of 15.4 μm-17.2 μm and fell in the range of 0.77T-0.86T with reference to the conductive circuit thickness (T). The deviation (σ) of |W1−W2| was 1.58 μm.

Reference Example 7

By changing a mask to form plated resist patterns as well as adjusting electrolytic copper-plating conditions and the conductive circuit thickness after sanding in Example 16, the (L/S) of signal lines was made 20.0 μm/20.0 μm and the conductive circuit thickness (T) was made 20 μm. Also, the etching time was changed from 30 seconds to 50 seconds. As a result, the value of |W1−W2| in this reference example was in the range of 15.6 μm-17.0 μm and fell in the range of 0.78T-0.85T with reference to the conductive circuit thickness (T). The deviation (σ) of |W1−W2| was 1.77 μm.

Reference Example 8

A multilayered PWB was manufactured according to the same procedure as in Example 11, except the second etching process was conducted not by using slit nozzles, but by immersion for one minute in the same etching solution as the first etching process.

The value of |W1−W2| in this reference example was in the range of 0.5 μm-3.65 μm and fell substantially in the range of 0.10T-0.73T with reference to the conductive circuit thickness (T). However, since this example also employed the immersion etching process where the etching solution does not flow, etching speeds were significantly different depending on the etched portions and accordingly, conductive circuit configurations of wiring circuits were considerably different from each other. As a result, the deviation (σ) of |W1−W2| was 2.43 μm.

Reference Example 9

A multilayered PWB was manufactured according to the same procedure as in Reference Example 8, except roughened surfaces were not formed on the conductive circuit surfaces after conductive circuits were formed.

Reference Example 10

A multilayered PWB was manufactured according to the same procedure as in Example 12, except the second etching process was conducted not by using slit nozzles, but by immersion for one minute in the same etching solution as the first etching process.

The value of |W1−W2| in this reference example was in the range of 0.75 μm-5.475 μm and fell substantially in the range of 0.10T-0.73T with reference to the conductive circuit thickness (T).

However, since this reference example also employed the immersion etching process where the etching solution does not flow, etching speeds were significantly different depending on the etched portions, and accordingly conductive circuit configurations of wiring circuits were considerably different from each other. As a result, the deviation (σ) of |W1−W2| was 2.34 μm.

Reference Example 11

A multilayered PWB was manufactured according to the same procedure as in Reference Example 10, except roughened surfaces were not formed on the conductive circuit surfaces after conductive circuits were formed.

Reference Example 12

A multilayered PWB was manufactured according to the same procedure as in Example 13, except the second etching process was conducted not by using slit nozzles, but by immersion for one minute in the same etching solution as the first etching process.

The value of |W1−W2| in this reference example was in the range of 1.0 μm-7.3 μm and fell substantially in the range of 0.10T-0.73T with reference to the conductive circuit thickness (T).

However, since this reference example also employed the immersion etching process where the etching solution does not flow, etching speeds were significantly different depending on the etched portions and accordingly, conductive circuit configurations of wiring circuits were considerably different from each other. As a result, the deviation (σ) of |W1−W2| was 2.45 μm.

Reference Example 13

A multilayered PWB was manufactured according to the same procedure as in Reference Example 12, except roughened surfaces were not formed on the conductive circuit surfaces after conductive circuits were formed.

Reference Example 14

A multilayered PWB was manufactured according to the same procedure as in Example 15, except the second etching process was conducted not by using slit nozzles, but by immersion for one minute in the same etching solution as the first etching process.

The value of |W1−W2| in this reference example was in the range of 1.50 μm-10.95 μm and fell substantially in the range of 0.10T-0.73T with reference to the conductive circuit thickness (T).

However, since this reference example also employed the immersion etching process where the etching solution does not flow, etching speeds were significantly different depending on the etched portions, and accordingly, conductive circuit configurations of wiring circuits were considerably different from each other. As a result, the deviation (σ) of |W1−W2| was 2.62 μm.

Reference Example 15

A multilayered PWB was manufactured according to the same procedure as in Reference Example 14, except roughened surfaces were not formed on the conductive circuit surfaces after conductive circuits were formed.

Evaluation tests were conducted as follows on the multilayered PWBs manufactured according to the above-described Examples 1-30, Reference Examples 1-15 and Comparative Examples 1-15.

Regarding the conductive circuits formed in each manufactured multilayered PWB, following are shown in Tables 1-1 and 1-2: the smallest conductive circuit width (L) in μm; the smallest conductive circuit space (S) in μm; conductive circuit thickness (T) in μm; the smallest value (min) and the largest value (Max) of |W1−W2| in μm; the smallest value (min) of |W1−W2| with reference to thickness (T); the largest value (Max) with reference to thickness (T); deviations (σ) in μm of |W1−W2|; and existence of roughened surfaces.

Units for (L), (S), (T), |W1−W2| and (σ) are omitted in Tables 1-1 and 1-2.

TABLE 1-1

| | L/S | T | min \|W1-W2\| | Max \|W1-W2\| | min \|W1-W2\| with ref. to T | Max \|W1-W2\| with ref. to T | σ | (*) note | roughened surface |
|---|---|---|---|---|---|---|---|---|---|
| Example 1 | 5.0/5.0 | 5.0 | 0.5 | 1.75 | 0.1T | 0.35T | 1.23 | ○ | yes |
| Example 2 | 7.5/7.5 | 7.5 | 0.675 | 2.775 | 0.09T | 0.37T | 1.33 | ○ | yes |
| Example 3 | 10.0/10.0 | 10.0 | 0.9 | 3.6 | 0.09T | 0.36T | 1.27 | ○ | yes |
| Example 4 | 12.5/12.5 | 12.5 | 1.25 | 4.375 | 0.1T | 0.35T | 1.34 | ○ | yes |
| Example 5 | 15.0/15.0 | 15.0 | 1.35 | 5.25 | 0.09T | 0.35T | 1.35 | ○ | yes |
| Example 6 | 5.0/5.0 | 5.0 | 1.7 | 3.7 | 0.34T | 0.74T | 1.77 | ○ | yes |
| Example 7 | 7.5/7.5 | 7.5 | 2.475 | 5.475 | 0.33T | 0.73T | 1.76 | ○ | yes |
| Example 8 | 10.0/10.0 | 10.0 | 3.5 | 7.3 | 0.35T | 0.73T | 1.78 | ○ | yes |
| Example 9 | 12.5/12.5 | 12.5 | 4.25 | 9.25 | 0.34T | 0.74T | 1.65 | ○ | yes |
| Example 10 | 15.0/15.0 | 15.0 | 5.25 | 10.95 | 0.35T | 0.73T | 1.72 | ○ | yes |
| Example 11 | 5.0/5.0 | 5.0 | 0.5 | 3.65 | 0.1T | 0.73T | 2.01 | ○ | yes |
| Example 12 | 7.5/7.5 | 7.5 | 0.675 | 5.625 | 0.09T | 0.75T | 2.13 | ○ | yes |
| Example 13 | 10.0/10.0 | 10.0 | 0.9 | 7.6 | 0.09T | 0.76T | 2.20 | ○ | yes |
| Example 14 | 12.5/12.5 | 12.5 | 1.25 | 9.25 | 0.1T | 0.74T | 2.45 | ○ | yes |
| Example 15 | 15.0/15.0 | 15.0 | 1.5 | 10.95 | 0.1T | 0.73T | 2.58 | ○ | yes |
| Example 16 | 5.0/5.0 | 5.0 | 0.5 | 1.8 | 0.1T | 0.36T | 1.23 | ○ | no |
| Example 17 | 7.5/7.5 | 7.5 | 0.75 | 2.625 | 0.1T | 0.35T | 1.38 | ○ | no |
| Example 18 | 10.0/10.0 | 10.0 | 1.0 | 3.6 | 0.1T | 0.36T | 1.22 | ○ | no |
| Example 19 | 12.5/12.5 | 12.5 | 1.125 | 4.625 | 0.09T | 0.37T | 1.34 | ○ | no |
| Example 20 | 15.0/15.0 | 15.0 | 1.35 | 5.25 | 0.09T | 0.35T | 1.34 | ○ | no |
| Example 21 | 5.0/5.0 | 5.0 | 1.65 | 3.75 | 0.33T | 0.75T | 1.65 | ○ | no |
| Example 22 | 7.5/7.5 | 7.5 | 2.625 | 5.475 | 0.35T | 0.73T | 1.71 | ○ | no |
| Example 23 | 10.0/10.0 | 10.0 | 3.5 | 7.3 | 0.35T | 0.73T | 1.58 | ○ | no |
| Example 24 | 12.5/12.5 | 12.5 | 4.125 | 9.375 | 0.33T | 0.75T | 1.66 | ○ | no |
| Example 25 | 15.0/15.0 | 15.0 | 4.95 | 10.95 | 0.33T | 0.73T | 1.71 | ○ | no |
| Example 26 | 5.0/5.0 | 5.0 | 0.45 | 3.65 | 0.09T | 0.73T | 2.11 | ○ | no |
| Example 27 | 7.5/7.5 | 7.5 | 0.75 | 5.475 | 0.1T | 0.73T | 2.11 | ○ | no |
| Example 28 | 10.0/10.0 | 10.0 | 1.0 | 7.5 | 0.1T | 0.75T | 2.33 | ○ | no |
| Example 29 | 12.5/12.5 | 12.5 | 1.125 | 9.25 | 0.09T | 0.74T | 2.45 | ○ | no |
| Example 30 | 15.0/15.0 | 15.0 | 1.5 | 10.95 | 0.1T | 0.73T | 2.55 | ○ | no |
| Ref. Ex. 1 | 12.5/12.5 | 12.5 | 1.25 | 9.25 | 0.1T | 0.74T | 2.58 | x | yes |
| Ref. Ex. 2 | 12.5/12.5 | 12.5 | 1.125 | 9.125 | 0.09T | 0.73T | 2.53 | x | no |
| Ref. Ex. 3 | 5.0/5.0 | 5.0 | 0.15 | 0.35 | 0.03T | 0.07T | 0.89 | ○ | yes |
| Ref. Ex. 4 | 20.0/20.0 | 20.0 | — | — | — | — | — | — | yes |
| Ref. Ex. 5 | 20.0/20.0 | 20.0 | — | — | — | — | — | — | no |
| Ref. Ex. 6 | 20.0/20.0 | 20.0 | 15.4 | 17.2 | 0.77T | 0.86T | 1.58 | ○ | yes |
| Ref. Ex. 7 | 20.0/20.0 | 20.0 | 15.6 | 17.0 | 0.78T | 0.85T | 1.77 | ○ | no |
| Ref. Ex. 8 | 5.0/5.0 | 5.0 | 0.5 | 3.65 | 0.1T | 0.73T | 2.43 | x | yes |
| Ref. Ex. 9 | 5.0/5.0 | 5.0 | 0.5 | 3.75 | 0.1T | 0.75T | 2.23 | x | no |
| Ref. Ex. 10 | 7.5/7.5 | 7.5 | 0.75 | 5.475 | 0.1T | 0.74T | 2.34 | x | yes |
| Ref. Ex. 11 | 7.5/7.5 | 7.5 | 0.675 | 5.475 | 0.09T | 0.74T | 2.35 | x | no |
| Ref. Ex. 12 | 10.0/10.0 | 10.0 | 1.0 | 7.3 | 0.1T | 0.73T | 2.45 | x | yes |
| Ref. Ex. 13 | 10.0/10.0 | 10.0 | 1.0 | 7.5 | 0.1T | 0.75T | 2.50 | x | no |
| Ref. Ex. 14 | 15.0/15.0 | 15.0 | 1.5 | 10.95 | 0.1T | 0.73T | 2.62 | x | yes |
| Ref. Ex. 15 | 15.0/15.0 | 15.0 | 1.35 | 10.95 | 0.09T | 0.73T | 2.73 | x | no |

TABLE 1-2

| | L/S | T | min \|W1-W2\| | Max \|W1-W2\| | min \|W1-W2\| with ref. to T | Max \|W1-W2\| with ref. to T | σ | (*) note | roughened surface |
|---|---|---|---|---|---|---|---|---|---|
| Comp. Ex. 1 | 5.0/5.0 | 5.0 | — | — | — | — | — | — | no |
| Comp. Ex. 2 | 7.5/7.5 | 7.5 | — | — | — | — | — | — | no |
| Comp. Ex. 3 | 10.0/10.0 | 10.0 | — | — | — | — | — | — | no |
| Comp. Ex. 4 | 12.5/12.5 | 12.5 | — | — | — | — | — | — | no |
| Comp. Ex. 5 | 15.0/15.0 | 15.0 | — | — | — | — | — | — | no |
| Comp. Ex. 6 | 5.0/5.0 | 5.0 | 3.9 | 4.3 | 0.78T | 0.86T | 1.58 | ○ | no |
| Comp. Ex. 7 | 7.5/7.5 | 7.5 | 6.075 | 6.6 | 0.81T | 0.88T | 1.78 | ○ | no |
| Comp. Ex. 8 | 10.0/10.0 | 10.0 | 7.7 | 8.6 | 0.77T | 0.86T | 1.62 | ○ | no |
| Comp. Ex. 9 | 12.5/12.5 | 12.5 | 9.625 | 10.875 | 0.77T | 0.87T | 1.73 | ○ | no |
| Comp. Ex. 10 | 15.0/15.0 | 15.0 | 12.0 | 12.75 | 0.8T | 0.85T | 1.88 | ○ | no |
| Comp. Ex. 11 | 5.0/5.0 | 5.0 | 0.15 | 0.35 | 0.03T | 0.07T | 0.88 | ○ | no |
| Comp. Ex. 12 | 7.5/7.5 | 7.5 | 0.375 | 0.6 | 0.05T | 0.08T | 0.89 | ○ | no |
| Comp. Ex. 13 | 10.0/10.0 | 10.0 | 0.3 | 0.8 | 0.03T | 0.08T | 1.02 | ○ | no |
| Comp. Ex. 14 | 12.5/12.5 | 12.5 | 0.5 | 0.875 | 0.04T | 0.07T | 0.78 | ○ | no |
| Comp. Ex. 15 | 15.0/15.0 | 15.0 | 0.45 | 1.2 | 0.03T | 0.08T | 0.88 | ○ | no |

(*) Note: "○" indicates that deviation (σ) was (0.04T + 2) or less and "x" indicates that deviation (σ) exceeded (0.04T + 2).

(Evaluation Test 1) Tests for Checking Noise

Voltage waveforms of each multilayered PWB manufactured according to Examples 1-30, Reference Examples 3, Comparative Examples 1-5 and 11-15 were observed using the below-described method to determine whether noise occurred when any of six different types of IC chips (No. 1-No. 6) were mounted on each PWB.

Adjacent testing wirings 1-5 were diagrammed parallel within the same conductive circuit layer, wirings 1, 3 and 5 were connected to an IC chip, and wirings 2 and 4 were not connected to the IC chip but were used as measuring wirings for testing. As IC chip 90, one of the following IC chips No. 1-No. 6 was mounted on each multilayered PWB. The selected IC chip was powered, and voltage waveforms of wirings 2 and 4 were observed to check for noise from wirings 1, 3 and 5 using an oscilloscope (brand name "11801C", made by Tektronix, Inc.)

No. 1: drive frequency 3.2 GHz, busclock (FSB) 1066 MHz
No. 2: drive frequency 3.0 GHz, busclock (FSB) 800 MHz
No. 3: drive frequency 2.8 GHz, busclock (FSB) 533 MHz
No. 4: drive frequency 2.6 GHz, busclock (FSB) 400 MHz
No. 5: drive frequency 1.4 GHz, busclock (FSB) 133 MHz
No. 6: drive frequency 1.1 GHz, busclock (FSB) 100 MHz The results are shown in Table 2. "x" indicates voltage waveforms were detected, and "○" indicates they were not detected, when wirings 2 and 4 were tested.

was detected between adjacent conductive circuits, because the capacitor capacitance was large between adjacent conductive circuits.

When testing the multilayered PWBs manufactured according to Reference Example 3 and Comparative Example 11, on which IC chip No. 5 was mounted respectively, noise was detected in Reference Example 3 where IC chips with lower drive frequencies were mounted. However, in Comparative Example 11, where no roughened surfaces were formed, noise was not detected, although the (L/S) is 5 μm/5 μm as in Reference Example 3.

The above results show that noise tends to occur in PWBs where conductive circuit surfaces are roughened. However, it is observed that by applying the present invention, namely, by adjusting the value of |W1−W2| to the range between (0.10T) and (0.73T) with reference to the conductive circuit thickness (T), occurrence of noise can be reduced. In a multilayered

TABLE 2

| | mounted IC chips (drive frequencies) | | | | | |
|---|---|---|---|---|---|---|
| | No. 1 (3.2 GHz) | No. 2 (3.0 GHz) | No. 3 (2.8 GHz) | No. 4 (2.6 GHz) | No. 5 (1.4 GHz) | No. 6 (1.1 GHz) |
| Example 1 | ○ | ○ | ○ | ○ | ○ | ○ |
| Example 2 | ○ | ○ | ○ | ○ | ○ | ○ |
| Example 3 | ○ | ○ | ○ | ○ | ○ | ○ |
| Example 4 | ○ | ○ | ○ | ○ | ○ | ○ |
| Example 5 | ○ | ○ | ○ | ○ | ○ | ○ |
| Example 6 | x | ○ | ○ | ○ | ○ | ○ |
| Example 7 | x | ○ | ○ | ○ | ○ | ○ |
| Example 8 | x | ○ | ○ | ○ | ○ | ○ |
| Example 9 | x | ○ | ○ | ○ | ○ | ○ |
| Example 10 | x | ○ | ○ | ○ | ○ | ○ |
| Example 11 | x | x | ○ | ○ | ○ | ○ |
| Example 12 | x | x | ○ | ○ | ○ | ○ |
| Example 13 | x | x | ○ | ○ | ○ | ○ |
| Example 14 | x | x | ○ | ○ | ○ | ○ |
| Example 15 | x | x | ○ | ○ | ○ | ○ |
| Example 16 | ○ | ○ | ○ | ○ | ○ | ○ |
| Example 17 | ○ | ○ | ○ | ○ | ○ | ○ |
| Example 18 | ○ | ○ | ○ | ○ | ○ | ○ |
| Example 19 | ○ | ○ | ○ | ○ | ○ | ○ |
| Example 20 | ○ | ○ | ○ | ○ | ○ | ○ |
| Example 21 | x | ○ | ○ | ○ | ○ | ○ |
| Example 22 | x | ○ | ○ | ○ | ○ | ○ |
| Example 23 | x | ○ | ○ | ○ | ○ | ○ |
| Example 24 | x | ○ | ○ | ○ | ○ | ○ |
| Example 25 | x | ○ | ○ | ○ | ○ | ○ |
| Example 26 | x | x | ○ | ○ | ○ | ○ |
| Example 27 | x | x | ○ | ○ | ○ | ○ |
| Example 28 | x | x | ○ | ○ | ○ | ○ |
| Example 29 | x | x | ○ | ○ | ○ | ○ |
| Example 30 | x | x | ○ | ○ | ○ | ○ |
| Comp. Ex. 1 | x | x | x | x | ○ | ○ |
| Comp. Ex. 2 | x | x | x | x | ○ | ○ |
| Comp. Ex. 3 | x | x | x | x | ○ | ○ |
| Comp. Ex. 4 | x | x | x | x | ○ | ○ |
| Comp. Ex. 5 | x | x | x | x | ○ | ○ |
| Comp. Ex. 11 | x | x | x | x | ○ | ○ |
| Comp. Ex. 12 | x | x | x | x | ○ | ○ |
| Comp. Ex. 13 | x | x | x | x | ○ | ○ |
| Comp. Ex. 14 | x | x | x | x | ○ | ○ |
| Comp. Ex. 15 | x | x | x | x | ○ | ○ |
| Ref. Ex. 3 | x | x | x | x | x | ○ |

According to the testing results where IC chips No. 3 and No. 4 were mounted, among the conductive circuits having the (L/S) of 5 μm/5 μm, where noise most likely occurs, noise was not detected in Examples 1, 6, 11, 16, 21 and 26, whose |W1−W2| values fall in the range of 0.10T-0.73T with reference to the conductive circuit thickness (T).

Compared with the above results, noise was detected in Comparative Example 1. It was assumed that crosstalk noise PWB, such as Reference Example 3, where conductive circuit surfaces are roughened, it is assumed that noise may occur due to roughened surfaces, since the capacitor capacitance between conductive circuits is bigger than that of Comparative Example 11.

(Evaluation Test 2) Tests for Checking Malfunctions

Each multilayered PWB manufactured according to Examples 1-30, Reference Examples 1, 2, 8-15, and Comparative Examples 1-15 was tested using the below-described method to check if malfunctions occurred in the IC chip mounted on the PWB.

As IC chip 90, one of the following IC chips No. 1-No. 6 was selected and mounted on each multilayered PWB. Test signals were input to the external terminals 78 connected electrically to signals at IC chip 90. After the data were calculated at the IC chip, the results were output from the IC chip, and the test signals reached the external terminals again, the results were checked to see whether the data were correctly output by using, for example, a pulse pattern generator/error detector (brand name "D3186/3286" made by Advantest Corp.).

No. 1: drive frequency 3.2 GHz, busclock (FSB) 1066 MHz

No. 2: drive frequency 3.0 GHz, busclock (FSB) 800 MHz

No. 3: drive frequency 2.8 GHz, busclock (FSB) 533 MHz

No. 4: drive frequency 2.6 GHz, busclock (FSB) 400 MHz

No. 5: drive frequency 1.4 GHz, busclock (FSB) 133 MHz

No. 6: drive frequency 1.1 GHz, busclock (FSB) 100 MHz

The test results are shown in Tables 3-1 and 3-2. "x" indicates the output data were wrong, and "○" indicates they were correct.

TABLE 3-1

| | mounted IC chips (drive frequencies) | | | | | |
|---|---|---|---|---|---|---|
| | No. 1 (3.2 GHz) | No. 2 (3.0 GHz) | No. 3 (2.8 GHz) | No. 4 (2.6 GHz) | No. 5 (1.4 GHz) | No. 6 (1.1 GHz) |
| Example 1 | ○ | ○ | ○ | ○ | ○ | ○ |
| Example 2 | ○ | ○ | ○ | ○ | ○ | ○ |
| Example 3 | ○ | ○ | ○ | ○ | ○ | ○ |
| Example 4 | ○ | ○ | ○ | ○ | ○ | ○ |
| Example 5 | ○ | ○ | ○ | ○ | ○ | ○ |
| Example 6 | X | ○ | ○ | ○ | ○ | ○ |
| Example 7 | X | ○ | ○ | ○ | ○ | ○ |
| Example 8 | X | ○ | ○ | ○ | ○ | ○ |
| Example 9 | X | ○ | ○ | ○ | ○ | ○ |
| Example 10 | X | ○ | ○ | ○ | ○ | ○ |
| Example 11 | X | X | ○ | ○ | ○ | ○ |
| Example 12 | X | X | ○ | ○ | ○ | ○ |
| Example 13 | X | X | ○ | ○ | ○ | ○ |
| Example 14 | X | X | ○ | ○ | ○ | ○ |
| Example 15 | X | X | ○ | ○ | ○ | ○ |
| Example 16 | ○ | ○ | ○ | ○ | ○ | ○ |
| Example 17 | ○ | ○ | ○ | ○ | ○ | ○ |
| Example 18 | ○ | ○ | ○ | ○ | ○ | ○ |
| Example 19 | ○ | ○ | ○ | ○ | ○ | ○ |
| Example 20 | ○ | ○ | ○ | ○ | ○ | ○ |
| Example 21 | X | ○ | ○ | ○ | ○ | ○ |
| Example 22 | X | ○ | ○ | ○ | ○ | ○ |
| Example 23 | X | ○ | ○ | ○ | ○ | ○ |
| Example 24 | X | ○ | ○ | ○ | ○ | ○ |
| Example 25 | X | ○ | ○ | ○ | ○ | ○ |
| Example 26 | X | X | ○ | ○ | ○ | ○ |
| Example 27 | X | X | ○ | ○ | ○ | ○ |
| Example 28 | X | X | ○ | ○ | ○ | ○ |
| Example 29 | X | X | ○ | ○ | ○ | ○ |
| Example 30 | X | X | ○ | ○ | ○ | ○ |
| Comp. Ex. 1 | X | X | X | X | ○ | ○ |
| Comp. Ex. 2 | X | X | X | X | ○ | ○ |
| Comp. Ex. 3 | X | X | X | X | ○ | ○ |
| Comp. Ex. 4 | X | X | X | X | ○ | ○ |
| Comp. Ex. 5 | X | X | X | X | ○ | ○ |
| Comp. Ex. 6 | X | X | X | X | ○ | ○ |
| Comp. Ex. 7 | X | X | X | X | ○ | ○ |
| Comp. Ex. 8 | X | X | X | X | ○ | ○ |
| Comp. Ex. 9 | X | X | X | X | ○ | ○ |
| Comp. Ex. 10 | X | X | X | X | ○ | ○ |
| Comp. Ex. 11 | X | X | X | X | ○ | ○ |
| Comp. Ex. 12 | X | X | X | X | ○ | ○ |
| Comp. Ex. 13 | X | X | X | X | ○ | ○ |
| Comp. Ex. 14 | X | X | X | X | ○ | ○ |
| Comp. Ex. 15 | X | X | X | X | ○ | ○ |

TABLE 3-2

| | mounted IC chips (drive frequencies) | | | | | |
|---|---|---|---|---|---|---|
| | No. 1 (3.2 GHz) | No. 2 (3.0 GHz) | No. 3 (2.8 GHz) | No. 4 (2.6 GHz) | No. 5 (1.4 GHz) | No. 6 (1.1 GHz) |
| Ref. Ex. 1 | x | x | x | x | ○ | ○ |
| Ref. Ex. 2 | x | x | x | ○ | ○ | ○ |
| Ref. Ex. 8 | x | x | x | x | ○ | ○ |

TABLE 3-2-continued

| | mounted IC chips (drive frequencies) | | | | | |
|---|---|---|---|---|---|---|
| | No. 1 (3.2 GHz) | No. 2 (3.0 GHz) | No. 3 (2.8 GHz) | No. 4 (2.6 GHz) | No. 5 (1.4 GHz) | No. 6 (1.1 GHz) |
| Ref. Ex. 9 | x | x | x | ○ | ○ | ○ |
| Ref. Ex. 10 | x | x | x | x | ○ | ○ |
| Ref. Ex. 11 | x | x | x | ○ | ○ | ○ |
| Ref. Ex. 12 | x | x | x | x | ○ | ○ |
| Ref. Ex. 13 | x | x | x | ○ | ○ | ○ |
| Ref. Ex. 14 | x | x | x | x | ○ | ○ |
| Ref. Ex. 15 | x | x | x | ○ | ○ | ○ |

When test results were compared on each multilayered PWB where IC chip No. 4 with a drive frequency of 2.6 GHz was mounted, malfunctions were not detected where the relationship between the adjacent conductive circuits, namely |W1−W2|, fall in the range of 0.10T-0.73T, such as in Examples 1-30. However, in the other units tested where |W1−W2| does not fall in the above range, such as Comparative Examples 1-15, malfunctions occurred.

It is presumed that the different results derive from the difference in the capacitor capacitance between conductive circuits and the conductor volume of conductive circuits. Thus, signals were transmitted to IC chips without noise or delays in the PWBs, which are manufactured according to the present invention.

Comparisons were conducted on the multilayered PWBs manufactured according to Example 14 and Reference Example 1, where the value of |W1−W2| was almost the same, and IC chip No. 3 with a drive frequency of 2.8 GHz was mounted. The result shows that in Example 14, where deviation (σ) of |W1−W2| is (0.04T+2) or less, malfunctions were not detected and the results were satisfactory, whereas in Reference Example 1, malfunctions occurred. The higher the drive frequency, the more critical the timing when signals reach transistors. If deviation (σ) is (0.04T+2) or less, transmission speed differences between each wiring are small, thus it is presumed that malfunctions are less likely. The same applies to Example 29 and Reference Example 2.

Comparisons were conducted on each multilayered PWB with mounted IC chip No. 2 with a drive frequency of 3.0 GHz. From the results compared between Examples 1-10 and Examples 11-15, and also between Examples 16-25 and Examples 26-30, it is clear that more preferable results are obtained, when the value of |W1−W2| is in the range of 0.35T-0.73T.

The reasons for the above results are presumably that transmission speed differences among signals are small when the value of |W1−W2| is limited to a small range, and the occurrence of malfunctions is much less likely because of the smaller capacitor capacitance between conductive circuits. Further, test results show that the value of |W1−W2| is preferred to be in the range of 0.1T-0.35T. This is presumably because transmission speed differences among signals and capacitor capacitance between conductive circuits are reduced while the electric resistance of conductive circuits remained low.

(Evaluation Test 3) Test for Checking Noise

IC chips No. 3 used in Evaluation Test 1 were mounted on PWBs manufactured according to Reference Examples 4 and 5 and tested similarly to Evaluation Test 1. The results were "○", indicating no voltage waveforms were observed.

When Reference Examples 4 and 5 were compared with comparative examples, noise was not detected if the (L/S) was 20 μm/20 μm in conductive circuits even though their cross-sections were shaped similarly. This is presumably because the (L/S) is big. From this result, it is valuable if the present invention is employed in a PWB having conductive circuits whose (L/S) is 15 μm/15 μm or less.

(Evaluation Test 4) Test for Checking Malfunctions

IC chips No. 3 used in Evaluation Test 2 were mounted on PWBs manufactured according to Reference Examples 4-7 and tested similarly to Evaluation Test 2. The results were "○", indicating no malfunctions were observed. When Reference Examples 4-7 were compared with comparative examples, malfunctions were not observed if the (L/S) was 20 μm/20 μm in conductive circuits even though their cross-sections were shaped similarly. This is presumed to be because the (L/S) is big. From this result, it is valuable if the present invention is employed in a PWB having conductive circuits whose (L/S) is 15 μm/15 μm or less.

Example 31

A multilayered PWB was manufactured in a procedure similar to Example 1, except the surface to be etched was placed facedown and etched for 15 seconds using only the lower nozzles of those arranged on the upper and lower sections of the etching equipment.

Example 32

A multilayered PWB was manufactured in a procedure similar to Example 2, except the surface to be etched was placed facedown and etched for 15 seconds using only the lower nozzles of those arranged on the upper and lower sections of the etching equipment.

Example 33

A multilayered PWB was manufactured in a procedure similar to Example 3, except the surface to be etched was placed facedown and etched for 15 seconds using only the lower nozzles of those arranged on the upper and lower sections of the etching equipment.

Example 34

A multilayered PWB was manufactured in a procedure similar to Example 4, except the surface to be etched was placed facedown and etched for 15 seconds using only the lower nozzles of those arranged on the upper and lower sections of the etching equipment.

Example 35

A multilayered PWB was manufactured in a procedure similar to Example 5, except the surface to be etched was placed facedown and etched for 15 seconds using only the lower nozzles of those arranged on the upper and lower sections of the etching equipment.

Example 36

A multilayered PWB was manufactured in a procedure similar to Example 16, except the surface to be etched was placed facedown and etched for 15 seconds using only the lower nozzles of those arranged on the upper and lower sections of the etching equipment.

Example 37

A multilayered PWB was manufactured in a procedure similar to Example 17, except the surface to be etched was placed facedown and etched for 15 seconds using only the lower nozzles of those arranged on the upper and lower sections of the etching equipment.

Example 38

A multilayered PWB was manufactured in a procedure similar to Example 18, except the surface to be etched was placed facedown and etched for 15 seconds using only the lower nozzles of those arranged on the upper and lower sections of the etching equipment.

Example 39

A multilayered PWB was manufactured in a procedure similar to Example 19, except the surface to be etched was placed facedown and etched for 15 seconds using only the lower nozzles of those arranged on the upper and lower sections of the etching equipment.

Example 40

A multilayered PWB was manufactured in a procedure similar to Example 20, except the surface to be etched was placed facedown and etched for 15 seconds using only the lower nozzles of those arranged on the upper and lower sections of the etching equipment.

When values of |W1−W2| were measured in the above Examples 31-40, all the values fell in the range of 0.10T-0.35T with reference to conductive circuit thickness (T). An IC chip having a drive frequency of 3.46 GHz and busclock (FSB) of 1066 MHz was mounted on each multilayered PWB manufactured according to Examples 31-40, and the same tests as above Evaluation Tests 1 and 2 were conducted to check if noise occurred and the mounted IC chips showed malfunctions. The results were all "○", indicating no noise or malfunctions were observed.

As described above, the PWB according to one embodiment of the present invention is manufactured to have conductive circuits where the upper space (W1) and lower space (W2) of adjacent conductive circuits satisfy the formula, $0.10T \leq |W1-W2| \leq 0.73T$, with reference to conductive circuit thickness (T). If high-speed IC chips are mounted on PWBs having conductive circuits with such cross-sections, crosstalk or delayed signal transmission are suppressed, and thus malfunctions in IC chips are more effectively prevented, even if (L/S) is made microscopic.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a plurality of interlayer resin insulation layers comprising a first interlayer resin insulation layer and a second interlayer resin insulation layer; and
a plurality of conductive circuits formed on the first interlayer resin insulation layer and encapsulated by the first and second interlayer resin insulation layers such that spaces between the conductive circuits are filled with a resin material of the second interlayer resin insulation layer and covered with the resin material of the second interlayer resin insulation layer,
wherein the conductive circuits include a first conductive circuit and a second conductive circuit positioned adjacent to the first conductive circuit, each of the first and second conductive circuits has a trapezoidal cross section, and the first and the second conductive circuits satisfy a formula, $0.10T \leq |W1-W2| \leq 0.73T$, and the first conductive circuit and the second conductive circuit have W2 of 15 μm or less, where W1 represents a width of a space between upper surfaces of the first and second conductive circuits, W2 represents a width of a space between lower surfaces of the first and second conductive circuits, and T represents a thickness of each of the first and second conductive circuit.

2. The printed wiring board according to claim 1, wherein the first conductive circuit and the second conductive circuit have |W1−W2| which is not larger than 0.35 T but not smaller than 0.10T.

3. The printed wiring board according to claim 1, wherein the first conductive circuit and the second conductive circuit have |W1−W2| which is not larger than 0.73 T but not smaller than 0.35T.

4. The printed wiring board according to claim 1, wherein the first conductive circuit and the second conductive circuit have a standard deviation of |W1−W2| which is (0.04 T+2) or less.

5. The printed wiring board according to claim 1, wherein the conductive circuits have roughened surfaces.

6. The printed wiring board according to claim 1, wherein the first and second conductive circuits satisfy a formula, $0.8 \leq S_1/S_0 \leq 1.2$ where $S_0$ represents an area of a shape formed by connecting four vertices of one of the conductive circuits, and $S_1$ represents a cross-sectional area of the one of the conductive circuits.

7. The printed wiring board according to claim 1, further comprising a core substrate comprising a conductive through-hole structure comprising a conductive film and a filler surrounded by the conductive film.

8. The printed wiring board according to claim 7, wherein at least one of the first and second conductive circuits has a cross section with sidelines slightly curved outwardly.

9. The printed wiring board according to claim 7, wherein at least one of the first and second conductive circuits has a cross section with sidelines slightly curved inwardly.

10. The printed wiring board according to claim 1, wherein the first and second conductive circuits have a thickness in a range of 5-20 μm.

11. The printed wiring board according to claim 1, wherein adjacent sides of the first and second conductive circuits are not parallel to each other.

12. The printed wiring board according to claim 1, wherein at least one of the first and second conductive circuits has an oblique sideline that is slightly curved.

13. The printed wiring board according to claim 1, wherein at least one of the first and second conductive circuits has a cross section with sidelines slightly curved outwardly.

14. The printed wiring board according to claim 1, wherein at least one of the first and second conductive circuits has a cross section with sidelines slightly curved inwardly.

15. The printed wiring board according to claim 1, wherein each of the conductive circuits is structured by using an additive method, using a semi-additive method, or using a full-additive method.

16. The printed wiring board according to claim 1, wherein each of the first and second conductive circuits is a plating film.

17. The printed wiring board according to claim 1, wherein each of the first and second conductive circuits comprises an upper surface which is provided in substantially a same plane.

18. The printed wiring board according to claim 1, further comprising a solder resist layer formed over the interlayer resin insulating layers and conductive circuits, wherein the solder resist layer has an opening exposing a portion of one of the conductive circuits such that the portion of the one of the conductive circuits forms a solder pad.

* * * * *